United States Patent
Ueda et al.

(10) Patent No.: US 10,388,524 B2
(45) Date of Patent: Aug. 20, 2019

(54) FILM FORMING METHOD, BORON FILM, AND FILM FORMING APPARATUS

(71) Applicant: TOKYO ELECTRON LIMITED, Tokyo (JP)

(72) Inventors: Hirokazu Ueda, Nirasaki (JP); Masahiro Oka, Nirasaki (JP); Hiraku Ishikawa, Nirasaki (JP); Yoshimasa Watanabe, Nirasaki (JP); Syuhei Yonezawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/833,685

(22) Filed: Dec. 6, 2017

(65) Prior Publication Data
US 2018/0174838 A1   Jun. 21, 2018

(30) Foreign Application Priority Data

Dec. 15, 2016 (JP) .................. 2016-242984
Mar. 29, 2017 (JP) .................. 2017-065310
Jul. 14, 2017 (JP) .................. 2017-138289

(51) Int. Cl.
*H01L 21/033* (2006.01)
*H01L 21/311* (2006.01)
(Continued)

(52) U.S. Cl.
CPC .......... *H01L 21/0332* (2013.01); *C23C 16/38* (2013.01); *C23C 16/4412* (2013.01); *C23C 16/46* (2013.01); *C23C 16/5096* (2013.01); *C23C 16/511* (2013.01); *H01J 37/32201* (2013.01); *H01J 37/32229* (2013.01);
(Continued)

(58) Field of Classification Search
CPC .............. H01L 21/0337; H01L 21/0237
See application file for complete search history.

(56) References Cited

U.S. PATENT DOCUMENTS

2009/0258255 A1* 10/2009 Terashima .............. C30B 29/04
                                                         429/483

FOREIGN PATENT DOCUMENTS

JP          61104077 A     5/1986
JP          6383273 A      4/1988
(Continued)

OTHER PUBLICATIONS

Shojiro Komatsu, et al. "Effects of plasma and/or 193 nm excimer-laser irradiation in chemical-vapor deposition of boron films from B2H6+He" (J. Appl. Phys. 71(11), Jun. 1, 1992, pp. 5654-5664).

*Primary Examiner* — Caridad Everhart
*Assistant Examiner* — Ankush K Singal
(74) *Attorney, Agent, or Firm* — Nath, Goldberg & Meyer; Jerald L. Meyer

(57) ABSTRACT

There is provided a method of forming a boron film on a substrate on which a semiconductor device is formed, by plasmarizing a reaction gas containing a boron-containing gas under a process atmosphere regulated to a pressure which falls within a range of 0.67 to 33.3 Pa (5 to 250 mTorr). The boron film is formed on a substrate on which a semiconductor device is formed, by plasmarizing a reaction gas containing a boron-containing gas under a process atmosphere regulated to a pressure which falls within a range of 0.67 to 33.3 Pa (5 to 250 mTorr).

12 Claims, 23 Drawing Sheets

(51) Int. Cl.
*H01J 37/32* (2006.01)
*C23C 16/511* (2006.01)
*C23C 16/38* (2006.01)
*C23C 16/46* (2006.01)
*C23C 16/44* (2006.01)
*H01L 21/02* (2006.01)
*C23C 16/509* (2006.01)
*H01L 27/11551* (2017.01)
*H01L 27/11578* (2017.01)

(52) U.S. Cl.
CPC .. *H01J 37/32449* (2013.01); *H01L 21/02112* (2013.01); *H01L 21/02274* (2013.01); *H01L 21/0335* (2013.01); *H01L 21/0337* (2013.01); *H01L 21/31116* (2013.01); *H01L 21/31144* (2013.01); *H01J 2237/182* (2013.01); *H01J 2237/3321* (2013.01); *H01L 27/11551* (2013.01); *H01L 27/11578* (2013.01)

(56) References Cited

FOREIGN PATENT DOCUMENTS

| JP | 2129369 A | 5/1990 |
| JP | 2000133710 A | 5/2000 |
| JP | 200297574 A | 4/2002 |
| JP | 2006237478 A | 9/2006 |
| JP | 2013533376 A | 8/2013 |
| JP | 5656010 B2 | 12/2014 |

* cited by examiner

Etching gas

Example 2-1 (4.0Pa(30mTorr))

Example 2-2 (6.7Pa(50mTorr))

Example 2-3 (13.3Pa(100mTorr))

Example 2-4 (20.0Pa(150mTorr))

Comparative example 2-1 (40.0Pa(300mTorr))

Reference example 2-1
(Vertical type heat processing apparatus 66.7Pa(500mTorr))

Reference example 3-1
Microwave : 2.5kW, Density : 2.14g/cm$^2$

Reference example 3-2
Microwave : 4.0kW, Density : 2.11g/cm$^2$

Reference example 3-3
Microwave : 4.8kW, Density : 2.108g/cm$^2$

Reference example 4-1
Bias power : 0W

Reference example 4-2
Bias power : 50W

Reference example 4-3
Bias power : 150W

<Reference example 9>

Boron atom-containing region

Oxygen atom-containing region

FILM FORMING METHOD, BORON FILM, AND FILM FORMING APPARATUS

CROSS-REFERENCE TO RELATED APPLICATIONS

This application is based upon and claims the benefit of priority from Japanese Patent Application Nos. 2016-242984, 2017-065310 and 2017-138289, filed on Dec. 15, 2016, Mar. 29, 2017, and Jul. 14, 2017, respectively, the entire contents of which are incorporated herein by reference.

TECHNICAL FIELD

The present disclosure relates to a boron film used in a semiconductor device.

BACKGROUND

In recent years, with the progress of miniaturization of a very large scale integration (VLSI) process, technologies related to miniaturizing semiconductor devices and constructing the devices three-dimensionally have been developed. This increases the number of thin films that can be stacked. For example, a flash memory using a 3D NAND requires a process of dry-etching a thick laminated film having a thickness of 1 μm or more, including a silicon oxide (SiO2) film. During the dry etching, conventionally, amorphous silicon or amorphous carbon is used as a hard mask. However, the amorphous silicon or the amorphous carbon has insufficient etching selectivity with respect to an SiN/SiO composite film constituting a target etching layer, leading to insufficient dry etching resistance.

As such, the development of a new hard mask material having high dry etching resistance and high etching selectivity is required. A boron-based film has various excellent properties such as high dry etching resistance and low dielectric constant as an insulating film material, and thus, the application of the boron-based film to various applications (uses) has been reviewed. For example, the application of a boron nitride film as a boron-based film to a hard mask during etching is known. However, among boron-based films, a boron film has diverse possibilities but has rarely been applied to semiconductor devices.

In addition, in order to form a vibrator for an electroacoustic transducer with boron, a technique of forming a boron layer on a sprayed coating of boron or a boron compound at a temperature of 900 to 1,200 degrees C. using a mixture gas of boron trichloride and hydrogen as a raw material gas by a chemical vapor deposition (CVD) method is known. In addition, a technique of heating a gas mixture obtained by blowing an inert gas in a mixture of a borane complex and an inert organic medium and thermally decomposing the borane complex at a temperature of 200 to 600 degrees C. to deposit boron on a substrate is known. These techniques, however, do not relate to a semiconductor device.

Moreover, a basic research related to the formation of a boron film on a silicon substrate using a plasma CVD has been conducted but conditions for forming a boron film suitable for a hard mask have not been disclosed.

In addition, there is a technique for forming a film called "boron-rich film" used as a hard mask or the like. In this technique, it has been found that, in the boron-rich film, the content of boron is greater than 60% and the content of other components such as hydrogen, oxygen, carbon, nitrogen and the like is within a range of 1 to 40%. Further, it is has been found that the content of the other components can be less than 5% when the boron-rich film is used as a hard mask.

This technique, however, merely shows the formation of a boron-rich film containing boron within a concentration range of 54 to 66% and results obtained by evaluating its characteristics, without presenting an example. Thus, it is not clear whether it is actually possible to form a boron-rich film containing boron of a higher concentration based on such a technique.

Furthermore, according to the results obtained by performing a Fourier transform infrared spectroscopy (FTIR) analysis on a boron-rich film having a boron concentration of 54%, peaks corresponding to plural kinds of bonds such as B—OH (boron-hydroxy group bond), B—H (boron-hydrogen bond), and B—N (boron-nitrogen bond) were recognized, and among them, a maximum peak corresponded to B—N. This means that the boron-rich film actually formed based on the related art is merely a boron nitride film used as the conventional hard mask.

SUMMARY

The present disclosure provides some embodiments of a method capable of forming a boron film useful for a semiconductor device at a low temperature of 500 degrees C. or lower.

According to one embodiment of the present disclosure, there is provided a method of forming a boron film on a substrate on which a semiconductor device is formed, by plasmarizing a reaction gas containing a boron-containing gas under a process atmosphere regulated to a pressure which falls within a range of 0.67 to 33.3 Pa (5 to 250 mTorr).

According to another embodiment of the present disclosure, there is provided a boron film formed on a substrate on which a semiconductor device is formed, by plasmarizing a reaction gas containing a boron-containing gas under a process atmosphere regulated to a pressure which falls within a range of 0.67 to 33.3 Pa (5 to 250 mTorr).

According to yet another embodiment of the present disclosure, there is provided a film forming apparatus, including: a process vessel connected to a vacuum exhaust part for evacuating an interior of the process vessel and including a mounting part on which a substrate on which a semiconductor device is formed is mounted; a reaction gas supply part configured to supply a reaction gas containing a boron-containing gas into the process vessel in order to form a boron film on the substrate mounted on the mounting part; a plasma forming part configured to plasmarize the reaction gas supplied into the process vessel; and a pressure regulation part configured to regulate an internal process atmosphere of the process vessel evacuated by the vacuum exhaust part to a pressure which falls within a range of 0.67 to 33.3 Pa (5 to 250 mTorr) when the reaction gas is plasmarized.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present disclosure forms a boron film (B film) using a plasma CVD apparatus. The boron film is a film composed of boron alone, but contains a very small amount of impurities such as hydrogen (H), oxygen (O), carbon (C) or the like according to a raw material. These impurities mean that components present in a process atmosphere during a film forming process are introduced into the boron film and are not positively added to the boron film. Hereinafter, an example of a film forming apparatus used for forming a boron film will be described with reference to FIGS. 1 and 2.

Figure 1:
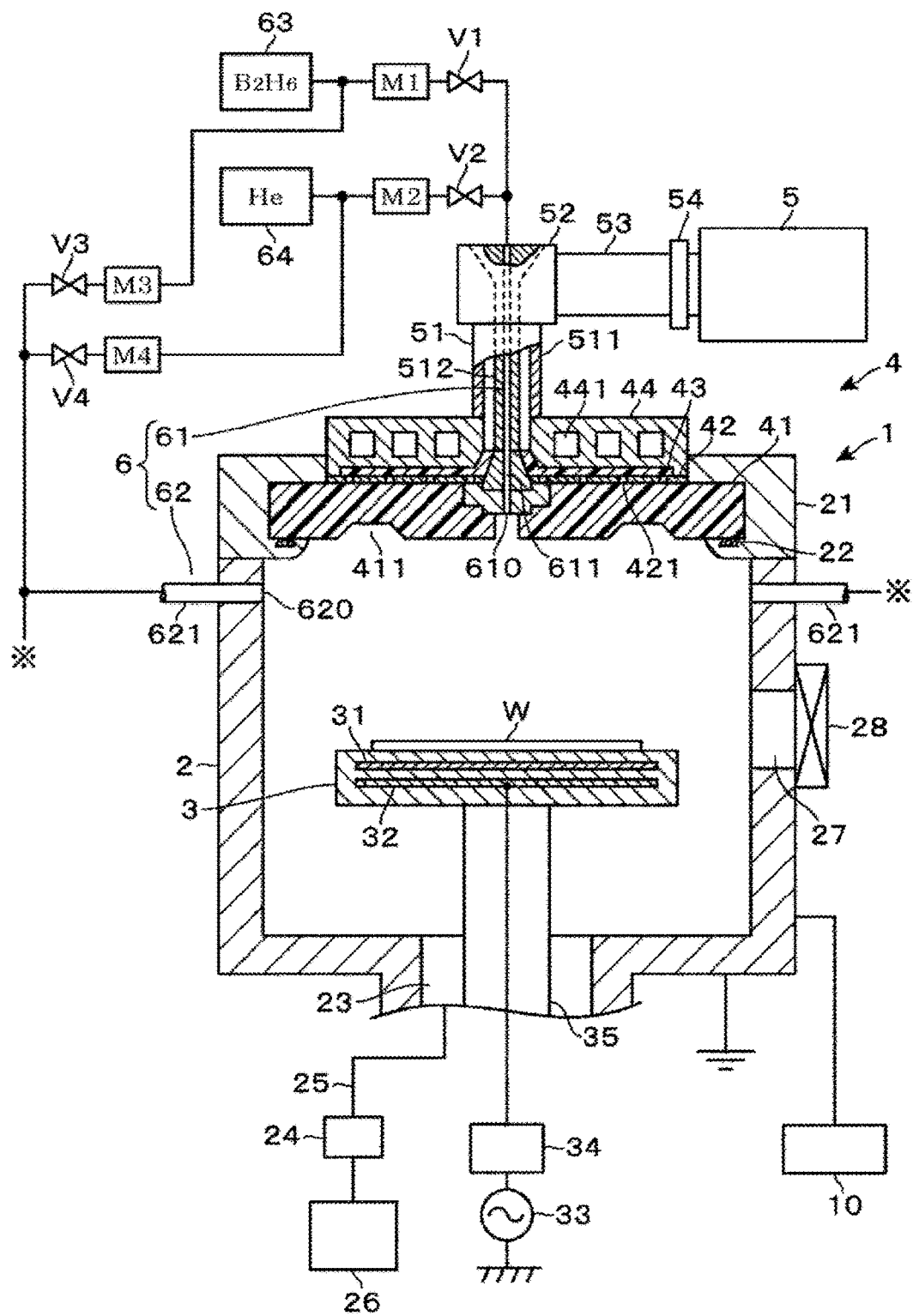
FIG. 1 is a longitudinal sectional side view of a film forming apparatus according to an embodiment of the present disclosure.

FIG. 1 is a longitudinal sectional side view illustrating a major part of a film forming apparatus 1. The film forming apparatus 1 includes, for example, a cylindrical process vessel 2 in which a film forming process is performed on a semiconductor wafer (hereinafter, referred to as a "wafer") W as a substrate accommodated therein. A mounting table (mounting part) 3 for mounting the wafer W thereon is installed inside the process vessel 2. The mounting table 3 has, for example, a circular planar shape.

An upper portion of the process vessel 2 is opened. A plasma generation mechanism (plasma forming part) 4 is installed in the opening so as to face the mounting table 3. The plasma generation mechanism 4 generates plasma using a microwave generated by a microwave generator 5. In FIG. 1, reference numeral 41 is a dielectric window which is installed to close the opening formed in the upper portion of the process vessel 2. The dielectric window 41 introduces the microwave into the process vessel 2, and is made of a substantially disc-shaped dielectric.

The dielectric window 41 is installed in a lid member 21 of the process vessel 2 with an O-ring 22 as a seal member interposed between the dielectric window 41 and the lid member 21. A tapered annular recess 411 for facilitating the generation of a standing wave using the introduced microwave is formed in a portion of a lower surface of the dielectric window 41, so that plasma is efficiently generated below the dielectric window 41 with the microwave. The distance between the upper surface of the mounting table 3 and the lower surface of the dielectric window 41 is set to, for example, 100 to 300 mm, and 200 mm in this example.

Figure 2:
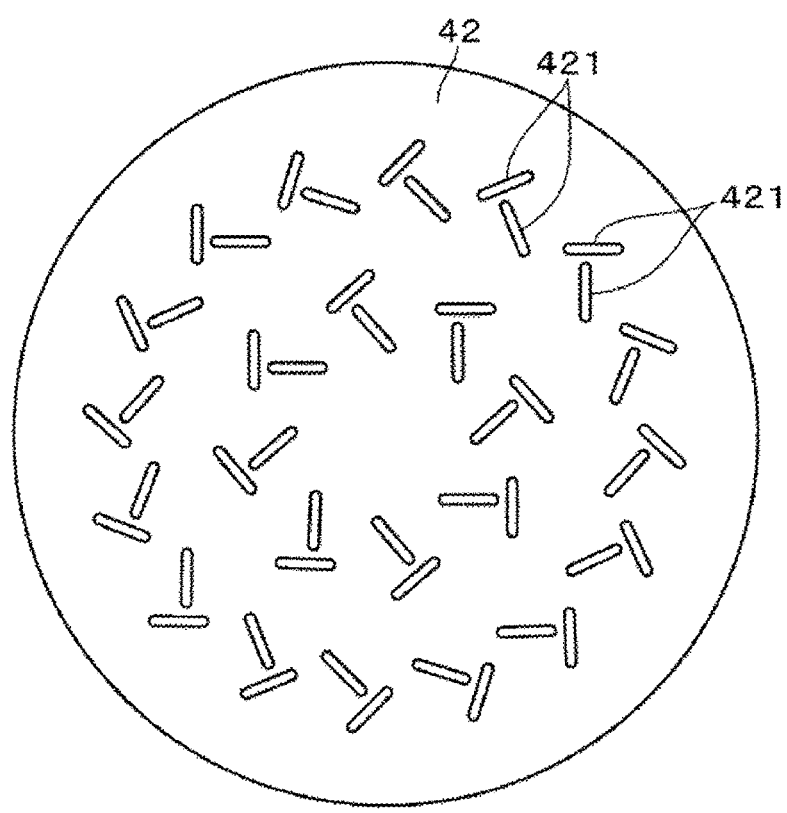
FIG. 2 is a plan view illustrating an example of an antenna plate used in the film forming apparatus.

An antenna plate 42 and a dielectric member 43 are installed on the dielectric window 41. The antenna plate 42 is formed in a thin disc shape and has a plurality of slot holes 421 formed therein. As illustrated in FIG. 2, the slot holes 421 are formed such that a pair of two slot holes 421 is orthogonal to each other at predetermined intervals. The plurality of pair of slot holes 421 is formed in a circumferential direction and in a diameter direction at predetermined intervals.

A cooling jacket 44 for adjusting a temperature of the dielectric member 43 and the like is installed on the dielectric member 43. The cooling jacket 44 has a coolant flow passage 441 formed therein, through which a coolant or the like circulates. A combination of the antenna plate 42, the dielectric member 43, and the cooling jacket 44 constitutes a radial line slot antenna (RLSA). An upper portion of the cooling jacket 44 is connected to the microwave generator 5 via a coaxial waveguide 51, a mode converter 52, a waveguide 53, and a matching unit 54. An outer conductor 511 of the coaxial waveguide 51 is connected to the cooling jacket 44, and an inner conductor 512 thereof is connected to the dielectric member 43.

The plasma generation mechanism 4 is composed of the microwave generator 5, the waveguide 53, the coaxial waveguide 51, the dielectric member 43, the antenna plate 42, and the dielectric window 41. The microwave of a TE mode of, for example, 2.45 GHz, generated by the microwave generator 5 passes through the waveguide 53 and is converted into a TEM mode by the mode converter 52. Subsequently, the microwave is propagated to the dielectric member 43 via the coaxial waveguide 51. Then, the microwave radially spreads outward from the interior of the dielectric member 43 in a diameter direction and is radiated from the plurality of slot holes 421 formed in the antenna plate 42 to the dielectric window 41. The microwave transmitted through the dielectric window 41 generates an electric field immediately below the dielectric window 41 to generate plasma inside the process vessel 2. A microwave plasma to be used for a process in the film forming apparatus 1 in this way is generated inside the process vessel 2 using the microwave radiated from the RLSA.

The mounting table 3 is configured to adsorb and hold the wafer W with an electrostatic chuck (not shown). A temperature adjustment mechanism 31 equipped with a heater for adjusting the temperature of the wafer W is installed inside the mounting table 3. In addition, the mounting table 3 includes an electrode 32. A high-frequency power source (high-frequency power source part) 33 for radio frequency (RF) bias is connected to the electrode 32 via a matching unit 34. The high-frequency power source 33 is configured to output a high frequency of, for example, 13.56 MHz, at a predetermined power (bias power).

The matching unit 34 accommodates a matcher for matching between an impedance at the side of the high-frequency power source 33 and an impedance at the side of a load such as mainly the electrode 32, plasma, or the process vessel 2. A blocking capacitor for self-bias generation is included in the matcher. In addition, during a plasma film formation, the supply of the bias voltage to the mounting table 3 is performed as necessary, but is not necessarily essential.

The mounting table 3 configured as above is supported by a cylindrical insulating support member 35 that extends vertically upward from below the bottom portion of the process vessel 2. Furthermore, for example, an annular exhaust port 23 is formed in the bottom portion of the process vessel 2 so as to penetrate a portion of the bottom portion of the process vessel 2 along, for example, an outer periphery of the support member 35. The exhaust port 23 is connected to an exhaust device 26 including a vacuum pump such as, for example, a turbomolecular pump (TMP) or the like via an exhaust pipe 25. In the exhaust pipe 25, there is installed a pressure regulation part 24 configured as a pressure regulation valve or the like for regulating a pressure of an internal process atmosphere of the process vessel 2 to a pressure within a preset range.

In the case where the exhaust device 26 is configured by the TMP, the TMP having a large exhaust flow rate may be installed such that the interior of the process vessel 2 can be controlled at a pressure within a range of 0.67 to 33.3 Pa (5 to 250 mTorr) even when a reaction gas is supplied at a large flow rate of, for example, 2,000 sccm or more (specifically 5,000 sccm or more).

In the case of supplying a reaction gas containing a boron-containing gas whose polymerization is performed at a high concentration, such as a diborane ($B_2H_6$) gas (to be described later), it is necessary to supply an inert gas such as a hydrogen ($H_2$) gas or a helium (He) gas to the process vessel 2 with the concentration of the boron-containing gas set at 15 vol % or less. Thus, by employing the TMP having a large exhaust flow rate as the exhaust device 26, it is possible to improve the deposition rate of a boron film by supplying a large flow rate of reaction gas while maintaining the internal pressure of the process vessel 2 to fall within a desired pressure range.

A gas supply part for supplying the reaction gas containing a boron-containing gas is installed in the process vessel 2. Examples of the boron-containing gas may include a diborane ($B_2H_6$) gas, a boron trichloride ($BCl_3$) gas, an alkylborane gas, a decaborane gas, and the like. Examples of the alkylborane gas may include a trimethylborane ($B(CH_3)_3$) gas, a triethylborane ($B(C_2H_5)_3$) gas, a gas expressed by B(R1) (R2) (R3), B(R1) (R2)H, or B(R1)H$_2$ (where R1, R2, and R3 are alkyl groups), and the like. Among these, the $B_2H_6$ gas may be suitably used.

Furthermore, the reaction gas contains an inert gas for plasma excitation and a hydrogen ($H_2$) gas. A noble gas such as an He gas or an Ar gas may be used as the inert gas. Although the present disclosure does not exclude the use of the $N_2$ gas, from the viewpoint of suppressing the generation of boron nitride, it is desirable to use the He gas, the Ar gas, or the like. Hereinafter, a case where the reaction gas containing the $B_2H_6$ gas as the boron-containing gas and the He gas as the inert gas for plasma excitation is used will be described as an example.

The gas supply part 6 includes a first gas supply part 61 for discharging a gas toward the center of the wafer W and a second gas supply part 62 for discharging a gas from the outside of the wafer W. The first gas supply part 61 includes a gas flow passage 611 formed inside the mode converter 52 and the inner conductor 512 of the coaxial waveguide 51. A gas supply hole 610 at a leading end of the gas flow passage 611 is opened toward the interior of the process vessel 2 at, for example, the central portion of the dielectric window 41. The gas flow passage 611 is connected to a supply source 63 of the $B_2H_6$ gas used as the boron-containing gas and a supply source 64 of the He gas used as the inert gas via a gas supply system including valves V1 and V2 and flow rate adjustment parts M1 and M2.

The second gas supply part 62 includes a plurality of gas supply pipes 621 connected to the upper side of the sidewall portion of the process vessel 2. Leading ends of the gas supply pipes 621 are opened as gas supply holes 620 in the sidewall of the process vessel 2. For example, the plurality of gas supply holes 620 are formed at equal intervals in the circumferential direction. The plurality of gas supply pipes 621 are connected to the supply source 63 of the $B_2H_6$ gas and the supply source 64 of the He gas via a gas supply system including valves V3 and V4 and flow rate adjustment parts M3 and M4. In this embodiment, the same kind of boron-containing gas and inert gas are supplied from the same gas supply sources 63 and 64 to the first gas supply part 61 and the second gas supply part 62 with their flow rates respectively adjusted. Furthermore, depending on the type of the film forming process, other gases may be respectively supplied from the first gas supply part 61 and the second gas supply part 62 with their flow rate ratios and the like individually adjusted.

A reaction gas having a flow rate which falls within a range of, for example, 1,000 to 10,000 sccm, specifically 2,000 to 10,000 sccm in order to improve the deposition rate of a boron film, is supplied from the first and second gas supply parts 61 and 62.

The $B_2H_6$ gas supply source 63, the He gas supply source 64, the first gas supply part 61, and the second gas supply part 62 correspond to a reaction gas supply part in this embodiment A loading/unloading port 27 through which the wafer W is transferred is formed in the sidewall portion of the process vessel 2. The loading/unloading port 27 is opened and closed by a gate valve 28. In addition, elevating pins for raising and lowering the wafer W when transferring the wafer W to and from an external transfer mechanism and an elevating mechanism (not shown) therefor are installed in the mounting table 3. It is desirable that the process vessel 2 and the members installed inside the process vessel 2 are not made of quartz if possible. The reason is because the quartz tends to easily emit oxygen (O), which facilitates the generation of boron oxide. Thus, the process vessel 2 is made of metal such as stainless steel or the like, and the dielectric window 41 and the mounting table 3 are made of a material such as alumina ($Al_2O_3$) or the like, which has difficulty emitting oxygen. The insulating support member 35 is made of, for example, alumina or aluminum nitride (AlN).

In addition, quartz is a material suitable for formation of a boron film in terms of acquiring a member with very high purity and suppressing a metal contamination of the process atmosphere entailed by etching the member by plasma. However, the quartz material involves the problem of oxygen emission described above.

Therefore, it is considered that a method of configuring a component (for example, the dielectric window 41, the mounting table 3, or the support member 35) made of an inorganic material disposed inside the process vessel 2 by the quartz member and coating at least the surface of the quartz member exposed toward the interior of the process vessel 2 with another material difficult to emit oxygen is employed.

The inventors of the present disclosure have found that it is appropriate for coating the surface of the quartz member with an yttria ($Y_2O_3$) film in terms of suppressing oxygen emission from the quartz member. As illustrated in Examples and Comparative examples described hereinbelow, the present inventors has recognized that the yttria film greatly acts to suppress oxygen emission from the quartz member, as compared with a case of coating the quartz member with another material, for example, a boron film, which is a material common to the film formed on the wafer W.

Furthermore, less emission of oxygen from the yttria film may mean that it is difficult to plasma etch the yttria film itself, and thus, the metal contamination of the boron film due to the emission of yttrium (Y) is low. In addition, by coating the yttria film under a clean atmosphere with low metal contamination, it is possible to reduce the metal contamination of the boron film, which is caused by the emission of another metal.

In some embodiments, the surface of a metal member exposed toward the interior of the process vessel 2 may also be coated with the yttria film or the boron film in order to suppress the metal contamination of the boron film entailed by etching or the like on the member by plasma.

Furthermore, a control part 10 configured as a computer is installed in the film forming apparatus 1. The control part 10 includes a program, a memory, a data processing part composed of a CPU, and the like. The program stores instructions that cause a film forming process (to be described later) to be executed by sending a control signal from the control part 10 to each part of the film forming apparatus 1. Specifically, the opening/closing timing of each valve, the ON/OFF timing of the microwave generator 5 and the high-frequency power source 33, the temperature of the mounting table 3 by the temperature adjustment mechanism 31, and the like are controlled by the program. The program is stored in a storage medium such as, e.g., a compact disc, a hard disk, a magneto-optical disc (MO) or the like, and installed on the control part 10.

Figure 3A:
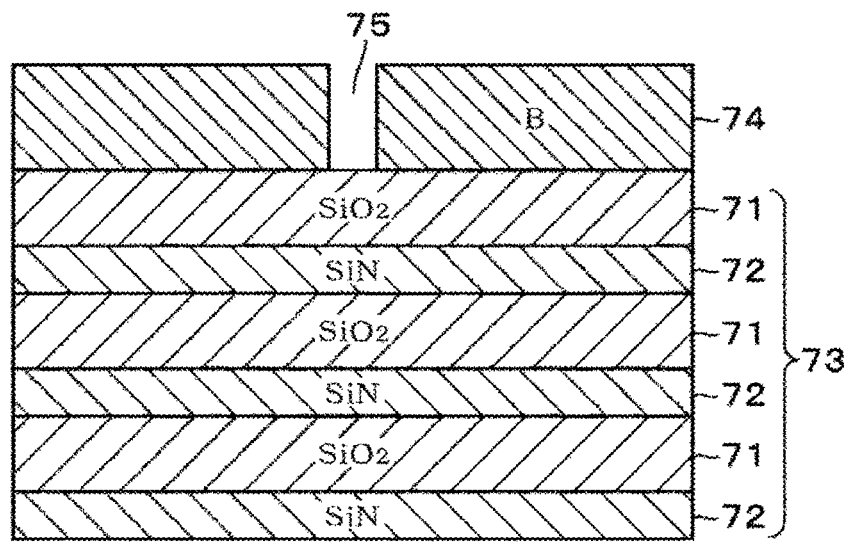
FIGS. 3A and 3B are longitudinal sectional side views illustrating an example of a surface structure of a wafer.
Figure 3B:
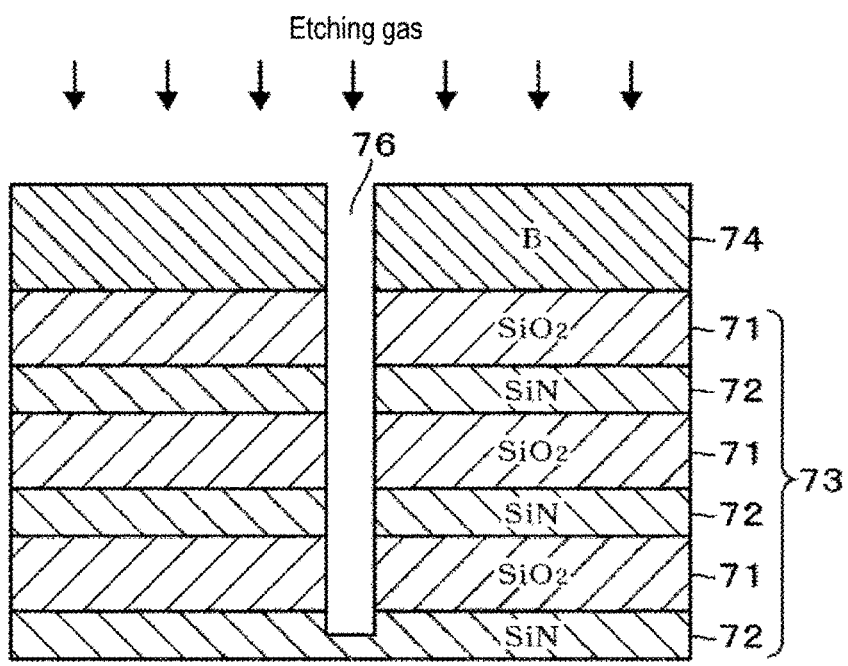

Next, a method of forming a boron film that is used as a mask when forming a recess by etching (dry etching) a film including, for example, a silicon oxide film ($SiO_2$ film) with a gas using the film forming apparatus 1 configured as above, will be described. FIGS. 3A and 3B illustrate an example of a surface structure of a wafer W having a mask (hard mask) composed of a boron film. For example, as illustrated in FIG. 3A, a laminated film 73 having a thickness of, for example, 1 µm or more, obtained by repeatedly forming an $SiO_2$ film 71 and an SiN film 72 used in a three-dimensional NAND circuit a plurality of times is formed on the surface of the wafer W. A boron film (B film) 74 having a thickness of, for example, 500 nm, is formed as a hard mask on the laminated film 73. FIG. 3A illustrates a state in which a recess 75 is formed in the boron film 74.

First, in a state in which the interior of the process vessel 2 is kept in a predetermined vacuum atmosphere, for example, a 12 inch wafer W, which is supported by an external transfer mechanism, is loaded into the process vessel 2 through a vacuum transfer chamber (not shown) and is delivered onto the mounting table 3 by cooperation with elevating pins (not shown). Then, the transfer mechanism is withdrawn from the process vessel 2, and the loading/unloading port 27 is closed by the gate valve 28. Subsequently, evacuation is performed to make the interior of the process vessel 2 in a so-called evacuated vacuum state so that a component such as, e.g., oxygen, remaining within the process vessel 2 is removed by the evacuation.

Subsequently, an internal pressure of the process vessel 2 is regulated to, for example, 0.67 to 33.3 Pa (5 to 250 mTorr) using the pressure regulation part 24, and a heating temperature (film formation temperature) of the wafer W is stabilized to a temperature which falls within a range of, for example, 60 to 500 degrees C. by the mounting table 3. Here, an example in which a lower limit value of the film formation temperature is set at 60 degrees C. as a range allowing for formation of a boron film although the temperature of the mounting table 3 is adjusted to a low temperature is illustrated. An example of the film formation temperature may range from 60 to 300 degrees C. in terms of improving the film quality of the formed boron film.

In particular, in the case of forming the boron film 74 used as a dry etching mask (hard mask) of the laminated film 73 including the $SiO_2$ film 71 described above with reference to FIGS. 3A and 3B, the film formation temperature may be set to fall within a range of 60 to 250 degrees C., which is lower than 300 degrees C. As illustrated in experimental results in Examples described hereinbelow, it was recognized that the boron film formed in the above temperature range has high dry etching resistance and is easy to remove by a specific type of etchant (aqueous nitric acid), thus having characteristics suitable for the hard mask.

Referring back to the operation of the film forming apparatus 1, after the temperature of the wafer W is adjusted, a $B_2H_6$ gas ($B_2H_6$ concentration: 10 vol %, He gas is diluted) and an He gas are introduced at flow rates of, for example, 200 sccm and 800 sccm, respectively, into the process vessel 2 from the first gas supply part 61 and the second gas supply part 62. Further, as already described above, a microwave of, for example, 3 kW is introduced into the process vessel 2 from the microwave generator 5.

A so-called plasma generation region in which an electron temperature of plasma is relatively high is formed immediately below the dielectric window 41. A reaction gas is plasmarized in the plasma generation region. The plasma generated in the plasma generation region spreads downward to form a plasma diffusion region. This plasma diffusion region is a region in which the electron temperature of plasma is relatively low. In this plasma diffusion region, the boron film is formed on the surface of the wafer W by the plasma CVD.

For example, it is assumed that the boron-containing gas such as a $B_2H_6$ gas or the like is used and the boron-containing gas is diluted with an inert gas (an He gas or an Ar gas) or a hydrogen gas to generate a reaction gas. At this time, the boron film formed on the surface of the wafer W under the aforementioned film formation conditions (the film formation pressure and the film formation temperature) includes a hydrogen atom which ranges from about 5 to 15 atom %, in addition to the boron atom. Meanwhile, oxygen or nitrogen present in the air is introduced as inevitable components and the concentration of the oxygen or nitrogen is less than 1.0 atom % as an atomic percentage in the boron film.

The boron film suitable for a hard mask has such composition features (see Example 10).

In this manner, after the boron film having a predetermined thickness is formed on the surface of the wafer W, the supply of the $B_2H_6$ gas from the gas supply part 6 is stopped. Thereafter, for example, the He gas is supplied from the gas supply part 6 to purge the interior of the process vessel 2. Subsequently, the interior of the process vessel 2 is evacuated up to a predetermined pressure to remove the He gas and the residual component within the process vessel 2. Thereafter, the interior of the process vessel 2 is set to a predetermined vacuum atmosphere and the process is completed. Thereafter, the loading/unloading port 27 is opened and the wafer W with the boron film formed thereon is unloaded by the transfer mechanism and is transferred to be subjected to a subsequent process.

In the subsequent process, for example, as illustrated in FIG. 3A, the recess 75 is formed in the boron film 74. Subsequently, for example, as illustrated in FIG. 3B, a gas such as Ar, $O_2$, $N_2$, $H_2$ or the like is appropriately added with a CF-based gas set to a base. At this state, the laminated film 73 of the $SiO_2$ film 71 and SiN film 72 is etched using a gas adjusted to vertically etch the laminate structure of SiN/SiO. Thus, the laminated film 73 including the $SiO_2$ film is etched by the gas to form the recess 76. The recess 76 is a trench having a depth of, for example, 500 nm or more, for example, 1 to 5 on.

While in the embodiment, the reaction gas has been described to be plasmarized by supplying the microwave to the reaction gas, the reaction gas may be plasmarized using a capacitively coupled plasma.

An embodiment in which a boron film is formed using film forming apparatuses 1a and 1b having parallel plate electrodes will be described with reference to FIGS. 4 and 5. In the film forming apparatuses 1a and 1b illustrated in FIGS. 4 and 5, components that are shared with the film forming apparatus 1 described above with reference to FIGS. 1 and 2 will be denoted by the same reference numerals as those used in FIGS. 1 and 2.

Figure 4:
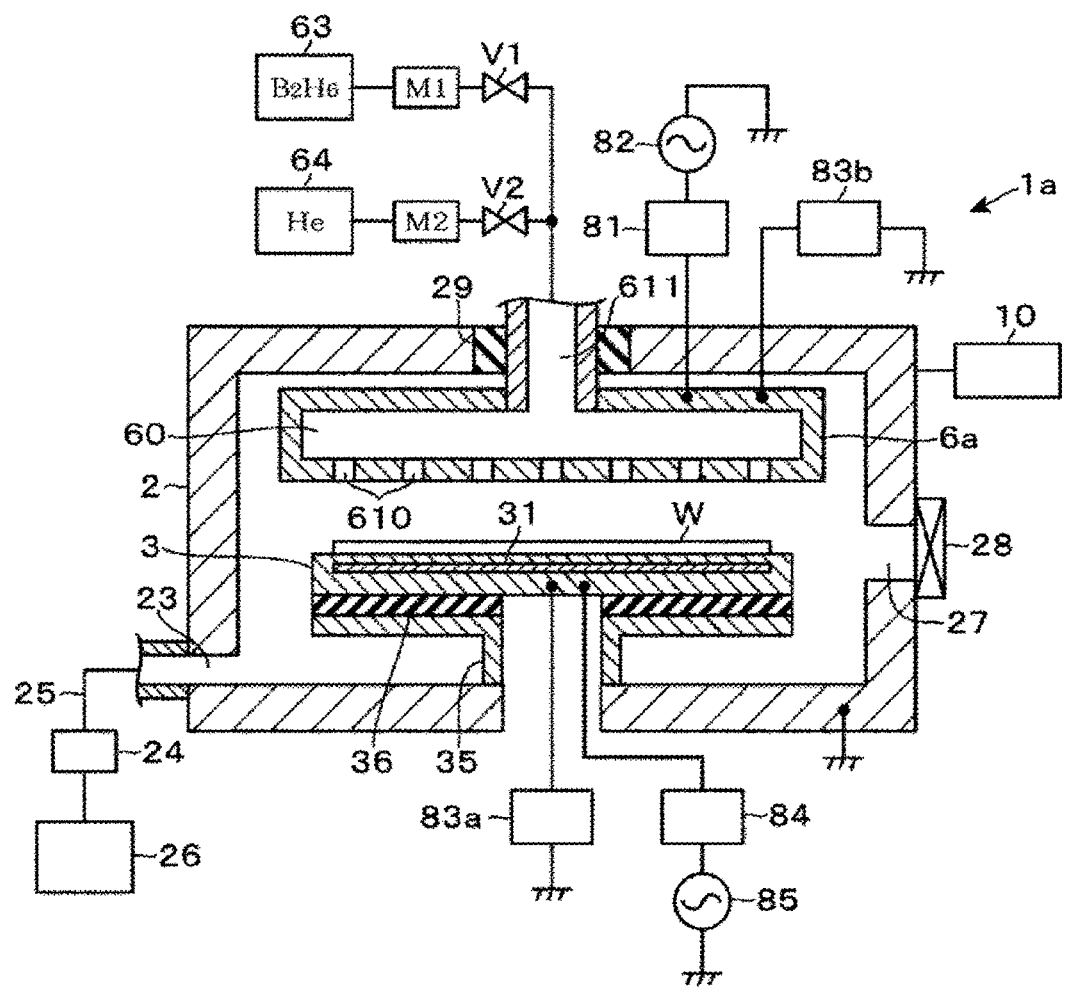
FIG. 4 is a longitudinal sectional side view illustrating one embodiment of a film forming apparatus including parallel flat plate electrodes.

FIG. 4 illustrates a configuration example of the film forming apparatus 1a in which a high-frequency power source for plasma formation (high-frequency power source part) 82 is connected to an upper electrode (gas shower head 6a) side instead of the plasma generation mechanism 4 using the microwave generator 5.

The film forming apparatus 1a of this embodiment includes parallel plate electrodes having a configuration in which the mounting table 3 with the wafer W mounted thereon also serves as a lower electrode, and the gas shower head 6a which is installed above the mounting table 3 and introduces a reaction gas into the process vessel 2 also serves as an upper electrode.

The gas shower head 6a is made of a conductive metal. A diffusion space 60 in which the reaction gas is diffused is formed inside the gas shower head 6a. A lower surface of the gas shower head 6a is positioned to substantially in parallel face a mounting surface of the wafer W. The lower surface of the gas shower head 6a corresponds to as a discharge surface of the reaction gas in which a plurality of gas supply holes 610 is formed.

For example, a gas flow passage 611 for introducing a reaction gas toward the diffusion space 60 therethrough is connected to the central portion of the upper surface of the gas shower head 6a, and is supported by the ceiling surface of the process vessel 2 via a pipe constituting the gas flow passage 611. The process vessel 2 is connected to a ground terminal. The gas shower head 6a (the pipe constituting the gas flow passage 611) and the process vessel 2 are insulated from each other by an insulating part 29.

The $B_2H_6$ gas supply source 63, the He gas supply source 64, and the gas shower head 6a correspond to a reaction gas supply part of this embodiment.

Meanwhile, the mounting table 3 of this embodiment is made of a conductive metal. In the embodiment illustrated in FIG. 5, the support member 35 disposed on the bottom surface of the process vessel 2 is also made of a conductive metal. The mounting table 3, the support member 35, the process vessel 2 connected to the ground terminal are insulated from each other by an insulating part 36.

In the embodiment of the film forming apparatus 1a illustrated in FIG. 4, in the parallel plate electrodes (the gas shower head 6a and the mounting table 3) configured as above, the gas shower head 6a used as the upper electrode is connected to the high-frequency power source 82 for plasma formation having a frequency of, for example, 60 MHz via the matching unit 81.

On the other hand, the mounting table 3 used as the lower electrode is connected to the ground terminal. Furthermore, the mounting table 3 may be connected to a high-frequency power source 85 for bias application having a frequency of, for example, 13.56 MHz, via the matching unit 84.

The gas shower head 6a used as the upper electrode, the mounting table 3 used as the lower electrode, and the high-frequency power source 82 for plasma formation connected to the gas shower head 6a correspond to a plasma forming part of this embodiment.

Here, as a method of suppressing an increase in a surface roughness of the boron film formed on the wafer W in the parallel plate type film forming apparatus 1a, (i) a method of using a high-frequency power source of 40 MHz or higher as the high-frequency power source 82 for plasma formation in order to reduce the impact of ions on the wafer W, (ii) a method of adjusting the impact of ions on the wafer W by increasing the impedance of the electrode (the gas shower head 6a used as the upper electrode in this embodiment) facing the wafer W mounted on the mounting table 3, or the like may be exemplified.

In the embodiment of the film forming apparatus 1a illustrated in FIG. 4, the high-frequency power source of 60 MHz is employed as the high-frequency power source 82 for plasma formation as already described above (method (i)).

Furthermore, in the film forming apparatus 1a illustrated in FIG. 4, a known impedance adjustment circuit 83a is installed between the mounting table 3 and the ground terminal, and an impedance adjustment circuit 83b is also installed at the side of the gas shower head 6a in parallel with the high-frequency power source 82 for plasma formation. By using the impedance adjustment circuits 83a and 83b, an impedance adjustment of increasing the impedance of the upper electrode (the gas shower head 6a) facing the wafer W mounted on the mounting table 3 is performed (method (ii)).

Figure 5:
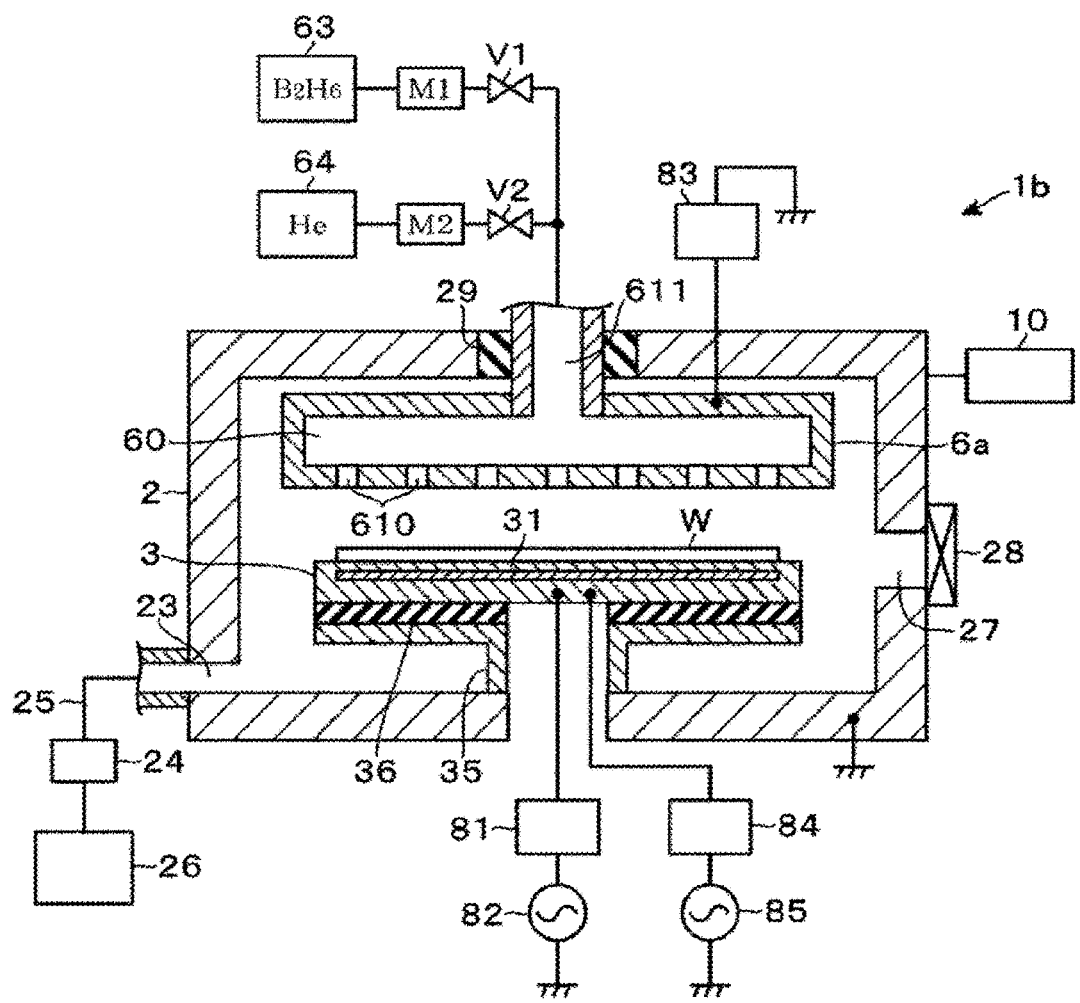
FIG. 5 is a longitudinal sectional side view illustrating another embodiment of the film forming apparatus including parallel flat plate electrodes.

Next, FIG. 5 illustrates a configuration example of the film forming apparatus 1b in which the high-frequency power source 82 for plasma formation is connected to the side of the lower electrode (mounting table 3).

In the film forming apparatus 1b of this embodiment, the configurations of the gas shower head 6a and the mounting table 3 and the configuration in which the high-frequency power source 85 for bias application is connected to the mounting table 3 are similar to those of the film forming apparatus 1a described above with reference to FIG. 4.

On the other hand, in the embodiment of the film formation apparatus 1b, a configuration in which the high-frequency power source 82 for plasma formation having a frequency of, for example, 60 MHz, is connected to the mounting table 3 used as the lower electrode via the matching unit 81, is different from that of the film forming apparatus 1a illustrated in FIG. 4.

The gas shower head 6a used as the upper electrode, the mounting table 3 used as the lower electrode, and the high-frequency power source 82 for plasma formation connected to the mounting table 3 correspond to a plasma forming part of this embodiment.

Even in the film-forming apparatus 1b of this embodiment, the increase in the surface roughness of the boron film is suppressed by suppressing the impact of ions on the wafer W to a small level using a high-frequency power source of 40 MHz or higher (method (i)).

Furthermore, as illustrated in FIG. 5, the impedance adjustment circuit 83 is installed at the side of the gas shower head 6a to increase the impedance of the upper electrode (the gas shower head 6a) facing the wafer W mounted on the mounting table 3, thus reducing the impact of ions on the wafer W (method (ii)).

In addition, in the film forming apparatuses 1a and 1b illustrated in FIGS. 4 and 5, the method of suppressing the increase in the surface roughness of the boron film is not limited to the aforementioned methods (i) and (ii). For example, a circuit for adjusting a bias voltage (VPP) in the surface of the wafer W mounted on the mounting table 3 to approximately zero when the reaction gas is plasmarized, may be installed between the upper electrode (the gas shower head 6a) and the lower electrode (the mounting table 3).

Moreover, in the film forming apparatuses 1a and 1b illustrated in FIGS. 4 and 5, the insulating part 29 for supporting the gas shower head 6a and the insulating part 36 formed on the lower surface of the mounting table 3 may be formed of quartz members. The aforementioned yttria film, in which oxygen may be difficult to emit, may be coated on surfaces of the quartz members which are exposed toward the interior of the process vessel 2.

In the film forming apparatuses 1a and 1b having the aforementioned configuration, when a reaction gas is supplied into the process vessel 2 and a high-frequency power is supplied from the matching unit 81 to the upper electrode (the gas shower head 6a of the film forming apparatus 1a) or the lower electrode (the mounting table 3 of the film forming apparatus 1b), a capacitively coupled plasma is formed by plasmarizing the reaction gas according to capacitive coupling between the upper electrode and the lower electrode. Furthermore, the point that the boron film is formed on the surface of the wafer W by the plasmarized reaction gas is similar to that of the film forming apparatus 1 according to the embodiment having the microwave generator 5.

The film forming apparatus 1 illustrated in FIGS. 1 and 2 for forming the boron film using the microwave plasma, and the film forming apparatuses 1a and 1b illustrated in FIGS. 4 and 5 for forming the boron film using the capacitively coupled plasma have been described above.

In addition to this, the boron film may be formed using an inductively coupled plasma. In this case, for example, a coil antenna is installed outside a process vessel with a transmission window installed between the coil antenna and the process vessel, and a high-frequency power is applied to the coil antenna to generate a uniform induction electric field inside the process vessel through the transmission window. Meanwhile, by supplying a reaction gas containing a boron-containing gas into the process vessel, the reaction gas is plasmarized by the induction electric field to form a boron film.

In forming the born film using the microwave plasma, the capacitively coupled plasma, and the inductively coupled plasma, film formation conditions of the plasma CVD are as follows. A pressure of a process atmosphere in which the wafer W is mounted is 0.67 to 33.3 Pa (5 to 250 mTorr). A temperature (film formation temperature) of the mounting table 3 during the film formation process is 60 to 500 degrees C., specifically 60 to 250 degrees C. which is lower than 300 degrees C. A more strict range may differ depending on the type of plasma. For example, a high-frequency power of about 2.8 to 7 W/cm$^2$ per unit area of a sample is supplied. When the film formation process is performed on the wafer W having a size of 12 inches, the high-frequency power is 2 to 5 kW.

In addition, in a supply flow rate condition of the reaction gas, taking, as an example, a case where a total supply flow rate of the reaction gas is fixed to 1,000 sccm, a flow rate of the $B_2H_6$ gas ($B_2H_6$ concentration: 10 vol %; He gas is diluted) may fall within a range of 200 to 1,000 sccm and a flow rate of the He gas may be set at the remaining range (0 to 800 sccm) (flow rate ratio of $B_2H_6$ component/He component: about 1/50 to 1/10).

In terms of increasing a deposition rate of the boron film, it is desirable that the concentration of $B_2H_6$ in the reaction gas to be supplied into the process vessel 2 is high. Meanwhile, the supply concentration of the $B_2H_6$ gas is also adjusted in consideration of suppression of self-polymerization of $B_2H_6$ within the $B_2H_6$ gas supply source 63 (e.g., a gas cylinder filled with the $B_2H_6$ gas). From this point of view, the upper limit of the supply concentration of the $B_2H_6$ gas is approximately 15 to 20 vol % in a case where the He gas or the hydrogen is diluted. Furthermore, since the He gas supplied from the He gas supply source 64 is added for formation of stable plasma, the supply amount of the He gas is adjusted in consideration of the state of plasma formed inside the process vessel 2, and the like.

According to the aforementioned embodiment, the boron film is formed by the plasma CVD and the electron density of plasma is high. Thus, the process temperature during the film forming process can be lowered to reduce thermal history, compared with a case where the film formation is performed without generating plasma. It is therefore possible to form the boron film without thermally damaging the wafer W. In addition, by using plasma, it is possible to form a quality dense film obtained by the thermal CVD method at the same film formation temperature. This quality dense film, although it is a boron film of the same composition formed by the CVD method, may be a high quality film having a relatively strong etching resistance and high etch selectivity.

As a process temperature of a CVD-based film required for film formation is lower, generally it has less effect on an already formed film of a semiconductor device. Due to this, the film formation temperature may be limited according to a film formation process in some cases, and thus, the film forming method of the present disclosure that allows the process temperature to be lowered relative to the thermal CVD method, is effective. On the other hand, as the film formation temperature is higher, a high quality dense CVD film is formed. The densification of a film may be achieved by plasma in the plasma CVD. Thus, it is possible to form a boron film having good film quality, while lowering the film formation temperature. In particular, in the embodiment illustrated in FIGS. 1 and 2, the reaction gas is plasmarized by supplying the microwave to the reaction gas. Thus, the film formation may be performed in a region in which the electron temperature of plasma is relatively low. Accordingly, although the temperature of the film formation process is low, the boron film having excellent film quality can be formed. Furthermore, since the reaction is promoted using plasma, the film forming process is effectively performed, shortening a film formation time.

The boron film has characteristics that etching resistance is high and dielectric constant is low. Thus, the boron film is useful as a component material of a semiconductor device. In particular, since the resistance when the $SiO_2$ film is dry-etched is high, when the film including the $SiO_2$ film is etched, the boron film may be etched with high selectivity, compared with an organic resist material, amorphous carbon (a-C), or amorphous silicon (a-Si) used as a hard mask in the related art. In addition, it is presumed that the concentration of impurities in the film is reduced because the boron film formed by the plasma CVD method has etch selectivity equal to or higher than that of the boron film formed by the thermal CVD method.

Recently, as the technique of three-dimensionally structuring or miniaturizing semiconductor devices has advanced, it is necessary to form a recess having a depth of a few μm by dry etching. When a film including an $SiO_2$ film is etched using a boron film as a hard mask, since the boron film is hard to etch under etching conditions of the $SiO_2$ film, even when the depth of the recess of the $SiO_2$ film is, for example, 500 nm or more, etching may be performed, while suppressing an increase in width of the recess of the $SiO_2$ film, with respect to a width of the recess of the boron film. In addition, since the etch selectivity to the $SiO_2$ film is high, even when the boron film is not thick, the boron film may serve as a hard mask. In this manner, the boron film is suitable as a mask when the recess is formed by etching the film including the $SiO_2$ film with a gas, and in particular, the boron film is more suitable when the depth of the recess is 500 nm or more, especially 1 μm or more.

In the above, an $H_2$ gas may be added as the reaction gas. This is effective in improving the smoothness of the film surface. In some embodiments, after forming the boron film, an Ar gas or an $H_2$ gas may be introduced into the process vessel 2 to generate an Ar plasma or an $H_2$ plasma. The Ar plasma or the $H_2$ plasma thus generated is irradiated to the boron film so as to modify the surface of the boron film with such a plasma. This can strengthen a boron-boron bond in the surface of the boron film, thereby increasing the denseness of the film and increasing the strength thereof.

In some embodiments, a protective film having high oxidation resistance such as, for example, an SiN film, an SiC film, an SiCN film, an a-Si film or the like may be formed on the boron film. The boron film tends to be easily oxidized. However, by forming these protective films, even when a process is performed under a plasma oxidizing atmosphere, such as the case of forming a TEOS film by the plasma CVD on a mask formed of the boron film, the oxidation of the boron film can be prevented to suppress deterioration in the film quality.

In the above, the recess formed by etching the film including the $SiO_2$ film with gas may be a recess such as a trench, a hole or the like. Furthermore, the application of the boron film is not limited to the mask at the time of etching, and it is applicable to other applications such as a barrier film for preventing diffusion.

EXAMPLES (Experiment 1)

Experiment was conducted to form a boron film on a wafer W

Example 1

A boron film was formed on a 12-inch (300 mm) wafer W having a stepped shape of polysilicon using a reaction gas containing a $B_2H_6$ gas and an He gas through the use of the film forming apparatus 1 illustrated in FIG. 1 under the following film formation process conditions, and a surface structure of the wafer W was evaluated by transmission electron microscopy (TEM) after the film formation.

Figure 6:
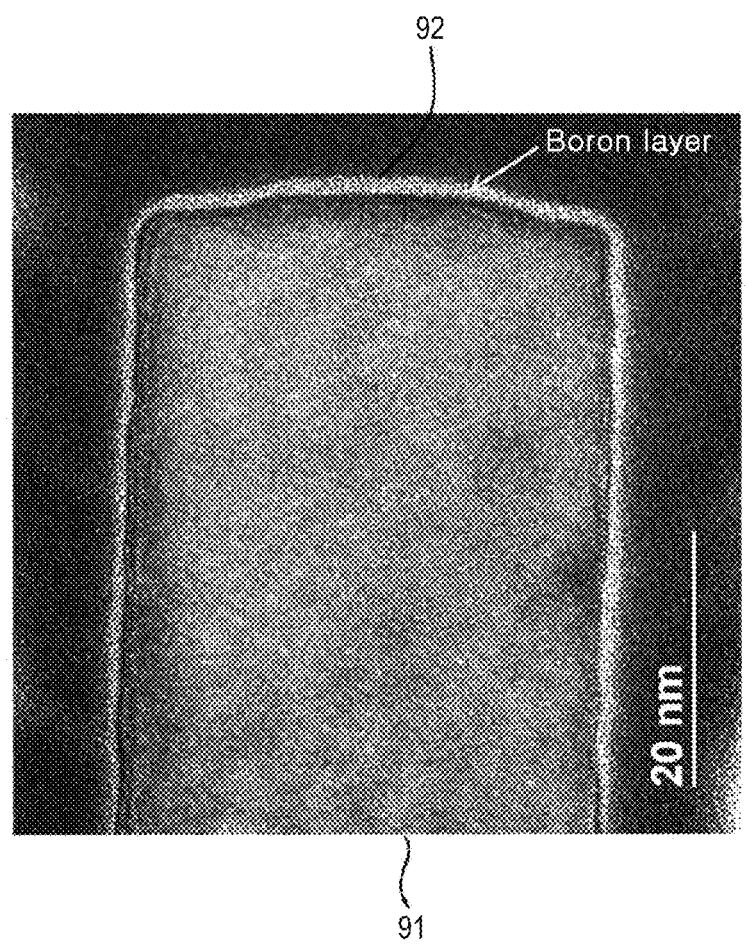
FIG. 6 is a view illustrating the imaging results of a boron film.

(Film Formation Process Conditions)
  Flow rate of $B_2H_6$ gas ($B_2H_6$ concentration: 0.7 vol %, He gas was diluted): 100 sccm
  Flow rate of He gas: 900 sccm
  Internal pressure of process vessel: 15 Pa (112.5 mTorr)
  High-frequency power: 3 kW
  Temperature of mounting table: 60 degrees C.
  Film formation time: 60 seconds
  Distance between upper surface of mounting table and lower surface of dielectric window: 245 m The imaging results of the TEM are illustrated in FIG. 6. The central portion in FIG. 6 shows a polysilicon film 91. The polysilicon film 91 having a plurality of convex portions is formed on the surface of the wafer W. Each of the convex portions of the polysilicon film 91 has, for example, a height of 50 nm and a width of 36.5 nm. A gap between adjacent convex portions is, for example, 40 to 80 nm. Furthermore, in FIG. 6, reference numeral 92 is a boron film. It was confirmed that the boron film 92 is formed to have a substantially uniform thickness on the entire periphery of the polysilicon films 91 having a stepped shape.

(Experiment 2)

A boron film was formed by changing the pressure of the process atmosphere (internal pressure of the process vessel) and a surface of the boron film was observed. In this experiment, in order to increase the deposition rate, the concentration of a $B_2H_6$ gas as a raw material gas was increased to 10 vol % and a shared flow rate of the $B_2H_6$ gas was set at 500 sccm. Meanwhile, in order to enhance the uniformity of the boron film formed by stabilizing plasma within the process vessel 2, the flow rate of an He gas supplied from the He gas supply source 64 was set at 500 sccm.

A. Experimental Conditions

Example 2-1

A boron film was formed on a surface of a silicon wafer W under the following film formation process conditions using the film forming apparatus 1 illustrated in FIG. 1, and a surface of the boron film thus formed was observed using a scanning electron microscope (SEM).

Flow rate of $B_2H_6$ gas ($B_2H_6$ concentration: 10 vol %, He gas was diluted): 500 sccm
Flow rate of He gas: 500 sccm
Internal pressure of process vessel: 4.0 Pa (30 mTorr)
High-frequency power: 3 kW
Temperature of mounting table: 60 degrees C.
Film formation time: 300 seconds
Distance between upper surface of mounting table and lower surface of dielectric window: 100 mm Example 2-2

A surface of a boron film formed under the same film formation process conditions as those of Example 2-1, except that the internal pressure of the process vessel was set at 6.7 Pa (50 mTorr), was observed.

Example 2-3

A surface of a boron film formed under the same film formation process conditions as those of Example 2-1, except that the internal pressure of the process vessel was set at 13.3 Pa (100 mTorr), was observed.

Example 2-4

A surface of a boron film formed under the same film formation process conditions as those of Example 2-1, except that the internal pressure of the process vessel was set at 20.0 Pa (150 mTorr), was observed.

Comparative Example 2-1

A surface of a boron film formed under the same film formation process conditions as those of Example 2-1, except that the internal pressure of the process vessel was set at 40.0 Pa (300 mTorr), was observed.

Reference Example 2-1

A surface of a boron film formed using a known vertical type heat processing apparatus is not provided with a plasma forming part was observed. The film formation temperature was set at 300 degrees C., and an internal pressure of a reaction vessel of the heat processing apparatus was set at 66.7 Pa (500 mTorr).

B. Experiment Results

Figure 7A:
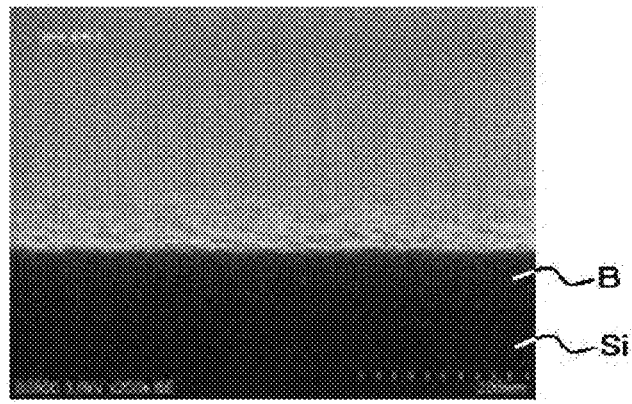
FIGS. 7A to 7C are photographs illustrating imaging results of boron films formed according to Examples in which a pressure of a process atmosphere is changed.
Figure 7B:
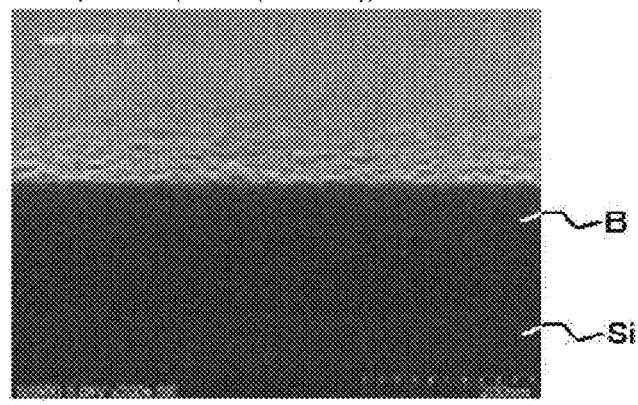
Figure 7C:
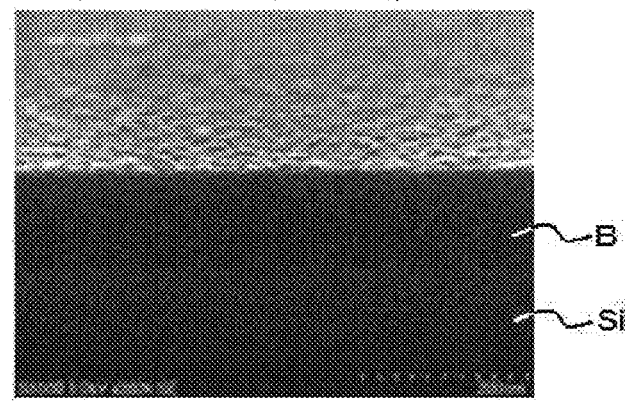
Figure 8A:
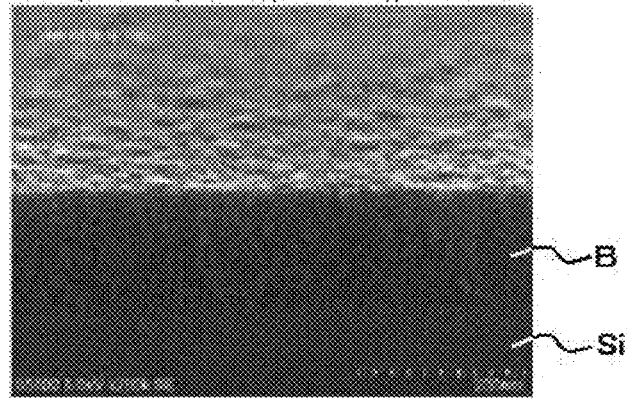
FIGS. 8A to 8C are photographs illustrating imaging results of boron films formed according to an Example, a Comparative example, and a Reference example in which a pressure is changed.
Figure 8B:
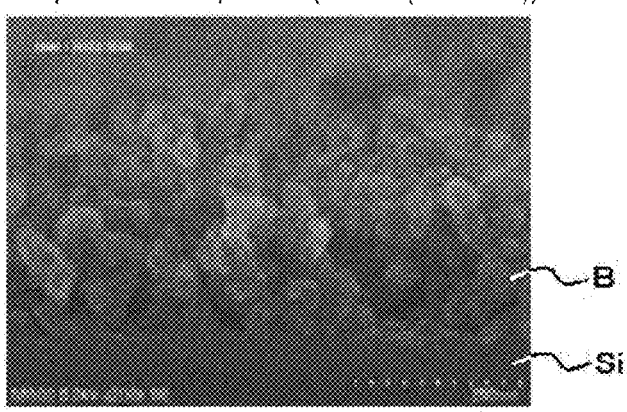
Figure 8C:
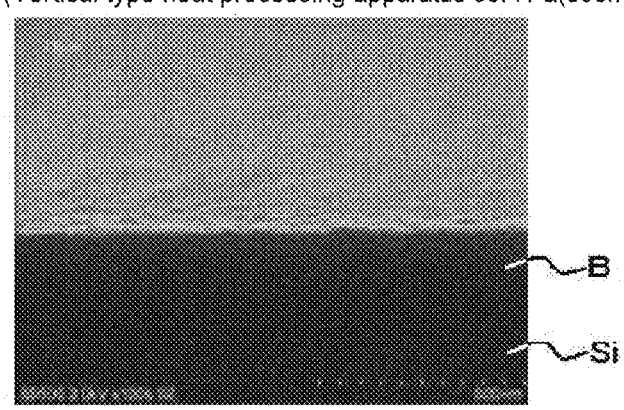

The imaging results of the surfaces of the boron films formed in Examples 2-1 to 2-3 are illustrated in FIGS. 7A to 7C, and the imaging results of the surfaces of the boron films formed in Example 2-4, Comparative example 2-1, and Reference example 2-1 are illustrated in FIGS. 8A to 8C.

It was confirmed that a comparison between the surface roughness of the boron films formed in Examples 2-1 to 2-4 shows that the surface roughness of the boron films is reduced as the pressure of the process atmosphere is reduced, resulting in a dense film quality. In particular, in Example 2-1 in which the pressure of the process atmosphere was lowest, it is possible to form a boron film having a surface roughness substantially equal to that of the boron film according to Reference example 2-1, which is formed without using plasma.

On the other hand, the boron film according to Comparative example 2-1, which is formed under a condition in which the pressure of the process atmosphere was high, had high surface roughness, failing to form a dense film (FIG. 8B)

When the surface roughness of a hard mask is high, there is a possibility that a line edge roughness (LER) of an etched pattern increases. In addition, since a non-dense hard mask is likely to be etched, the function as the hard mask may be insufficient.

The reasons why such a difference occurs depending on a pressure of the process atmosphere will be described. Plasma of the reaction gas ($B_2H_6$) contains various active species as precursors of a boron film, such as ions, radicals or the like. Among these active species, it is considered that the ions allows clusters (particles) of a boron film to grow in a predetermined direction, and thus, a boron film formed under a process atmosphere with rich ions tends to have high surface roughness and low density.

Thus, it is considered that it is possible to increase a ratio of radicals, while suppressing the generation of ions produced from the reaction gas ($B_2H_6$) by forming plasma under a low pressure condition and maintaining low plasma potential. As a result, it can be understood that, although the film formation temperature is relatively low, it is possible to form a boron film having film quality equal to or higher than that of the plasma-less heat treatment illustrated in Reference example 2-1.

For confirmation, an X-ray diffraction (XRD) analysis was conducted on the boron films according to Example 2-3 (pressure of the process atmosphere: 13.3 Pa (100 mTorr)) and Reference example 2-1 to analyze the crystal structures of the boron films. The analysis results showed that all the boron films have an amorphous structure. It can be said that these results reveal that the boron films were formed under a process atmosphere with rich radicals, rather than under a process atmosphere with rich ions, in which the clusters grow in a predetermined direction.

(Experiment 3)

A boron film was formed by changing the high-frequency power supplied to the microwave generator 5, and a surface of the boron film was observed.

A. Experimental Conditions

Reference Example 3-1

A surface of a boron film formed under the same film formation process conditions as those of Example 2-1, except that the high-frequency power supplied to the microwave generator 5 was set at 2.5 kW, was observed.

Reference Example 3-2

A surface of a boron film formed under the same film formation process conditions as those of Example 2-1, except that the high-frequency power supplied to the microwave generator 5 was set at 4.0 kW, was observed.

Reference Example 3-3

A surface of a boron film formed under the same film formation process conditions as those of Example 2-1, except that the high-frequency power supplied to the microwave generator 5 was set at 4.8 kW, was observed.
B. Experimental Results The imaging results of the surfaces of the boron films formed in Reference examples 3-1 to 3-3, and the density of the boron films are illustrated in FIGS. 9A to 9C.

Figure 9A:
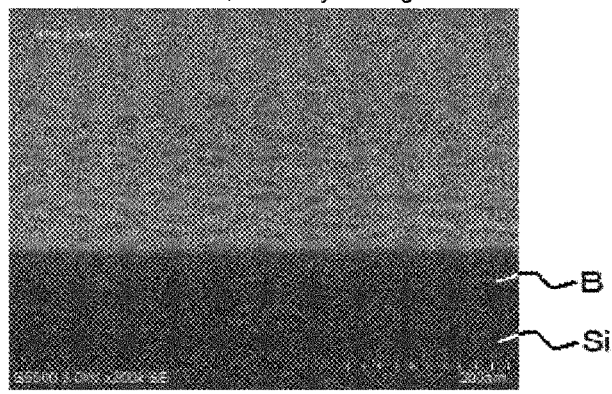
FIGS. 9A to 9C are photographs illustrating imaging results of boron films formed according to Reference examples in which a microwave power is changed.
Figure 9B:
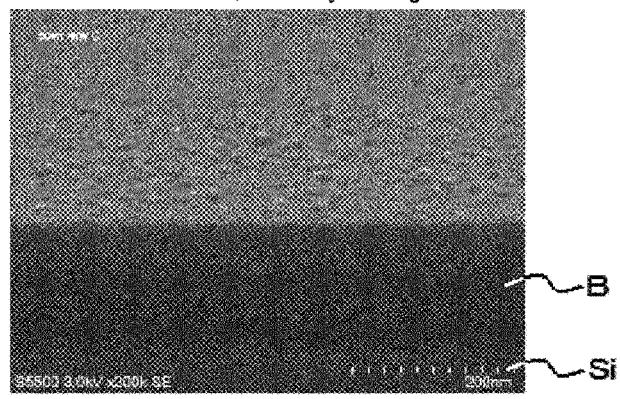
Figure 9C:
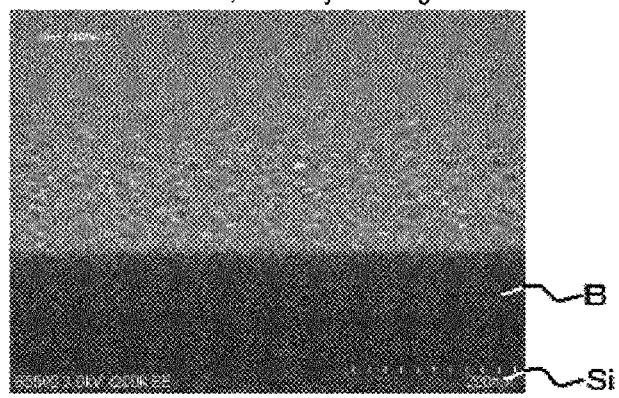

According to the results illustrated in FIGS. 9A to 9C, even when the film is formed by changing the high-frequency power (microwave power) supplied to the microwave generator 5, a large change was not manifested in the surface roughness density of the boron film. This indicates that the pressure of the process atmosphere reviewed in Experiment 2 has a greater influence on the surface roughness than on the power supplied to the plasma.

It can be said that the experimental results show that, if the boron film can be formed under a process atmosphere of low pressure, even in the film forming apparatuses 1a and 1b using the capacitively coupled plasma and employing different plasma formation techniques, it is possible to form a boron film with excellent film quality (with small surface roughness and being dense).
(Experiment 4)

A boron film was formed by changing the bias high-frequency power supplied from the high-frequency power source 33 of the film forming apparatus 1 illustrated in FIG. 1, and a surface of the boron film was observed.
A. Experimental Conditions Reference Example 4-1

A surface of a boron film formed under the same film formation process conditions (bias power of 0 W) as those of Example 2-1 was observed.

Reference Example 4-2

A surface of a boron film formed under the same film formation process conditions as of Reference example 4-1, except that the bias power was set at 50 W, was observed.

Reference Example 4-3

A surface of a boron film formed under the same film formation process conditions as those of Reference example 4-1, except that the bias power was set at 150 W, was observed.
B. Experimental Results The imaging results of the surfaces of the boron films formed in Reference examples 4-1 to 4-3 are illustrated in FIGS. 10A to 10C.

Figure 10A:
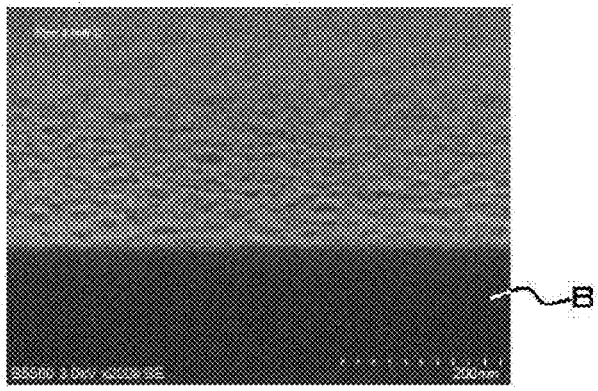
FIGS. 10A to 10C are photographs illustrating imaging results of boron films formed according to Reference examples in which a bias power is changed.
Figure 10B:
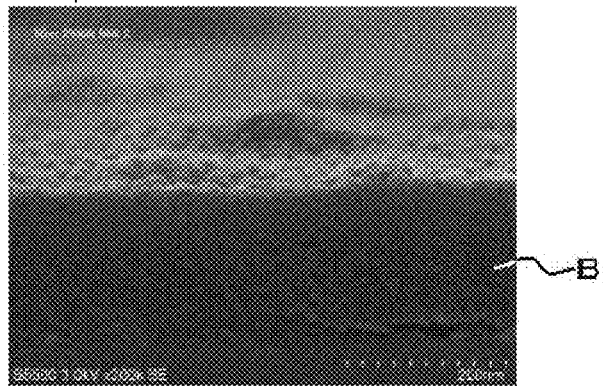
Figure 10C:
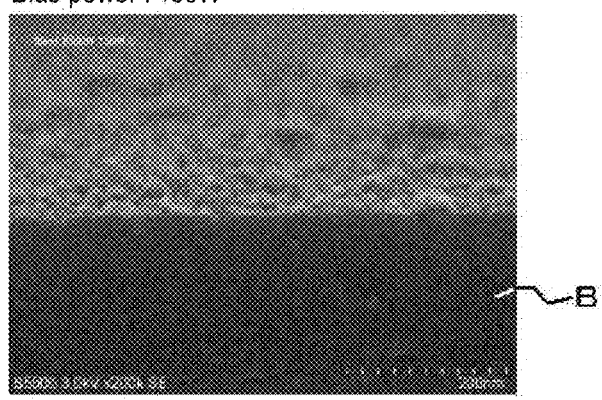

According to the results illustrated in FIGS. 10A to 10C, the surface roughness of the boron film tends to increase as the bias power applied to the mounting table 3 increases. It is considered that this is probably because the increase of the bias power increases the influence of ions in the plasma being drawn toward the wafer W side.

In this regard, since the film forming apparatuses 1a and 1b illustrated in FIGS. 4 and 5, which form plasma based on the capacitive coupling, can adjust the surface roughness of the boron film by using the methods (i) and (ii) already described above, even when the bias power is applied, it is possible to suppress an increase in the surface roughness of the boron film.
(Experiment 5)

An in-plane uniformity of a boron film formed by changing the pressure of the process atmosphere was confirmed.
A. Experimental Conditions Example 5

Figure 11:
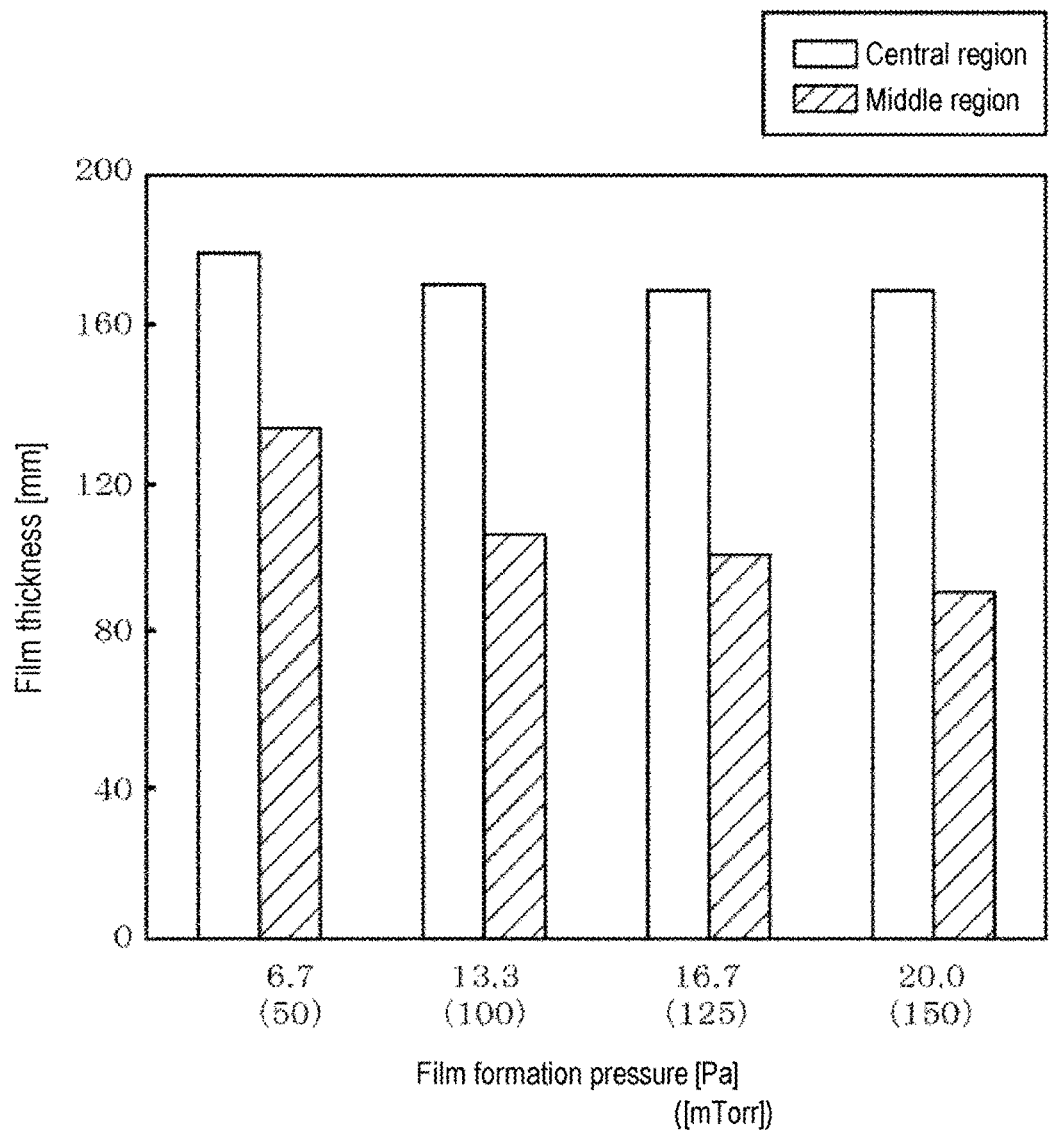
FIG. 11 is an explanatory view illustrating a relationship between an in-plane uniformity of a boron film and a film formation pressure.

A boron film was formed under the same film formation process conditions as those of Example 2-1, except that the film was formed for 5 minutes while changing the internal pressure of the process vessel to 6.7 Pa (50 mTorr), 13.3 Pa (100 mTorr), 16.7 Pa (125 mTorr), and 20.0 Pa (150 mTorr). Thereafter, a film thickness of the boron film in the central region of the wafer W (the center portion of the wafer W) and the middle region (at a position shifted by 90 mm in the radial direction from the center portion of the wafer W) was measured.
B. Experimental Results The results of Example 5 are illustrated in FIG. 11. In FIG. 11, the horizontal axis represents a pressure of the process atmosphere, and the vertical axis represents a film thickness of the boron film. Furthermore, whited columns indicate a film thickness of the boron film in the central region of the wafer W and diagonally hatched columns indicate a film thickness of the boron film in the middle region.

According to the results illustrated in FIG. 11, the film thickness of the boron film tends to increase in the central region of the wafer W at any pressure. On the other hand, it was confirmed that a difference in the film thickness between the central region and the middle region tends to decrease as the pressure of the process atmosphere is lowered.
(Experiment 6)

An etching rate of a boron film formed by changing the pressure of the process atmosphere was measured.
A. Experimental Conditions Example 6

A boron film was formed under the same film formation process conditions as those of Example 2-1 was repeated, except that the film was formed for 5 minutes while changing the internal pressure of the process vessel to 6.7 Pa (50 mTorr), 13.3 Pa (100 mTorr), and 20.0 (150 mTorr). Thereafter, an etching gas-based plasma etching was performed on the boron film under the same conditions as those of the case of manufacturing a dynamic random access memory (DRAM), and an etching rate of the boron film was measured.

Figure 12:
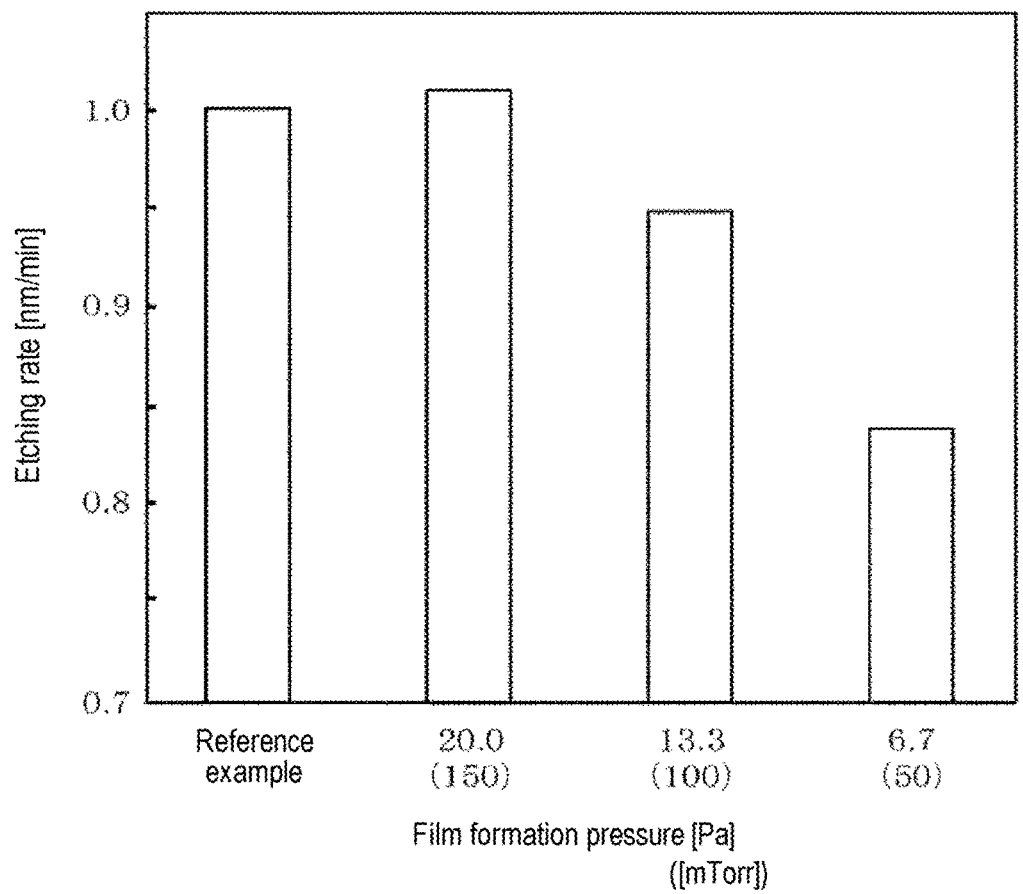
FIG. 12 is a first explanatory view illustrating a relationship between a film formation pressure of a boron film and an etching rate.

Furthermore, as a reference example, the same etching test was also performed on the boron film formed by the method described in Reference example 2-1 already described above.
B. Experimental Results The results of Example 6 are illustrated in FIG. 2. In FIG. 12, the horizontal axis represents a pressure of the process atmosphere or the reference example. The vertical axis indicates an etching rate of the boron film.

According to the results illustrated in FIG. 12, it was confirmed that the etching rate of the boron film decreases as the pressure of the process atmosphere is lowered, and thus, it is possible to form a boron film with high selectivity and suitable as a hard mask.
(Experiment 7)

An etching rate under conditions different from those of Experiment 6 was measured for a boron film formed while changing the pressure of the process atmosphere.
A. Experimental Conditions Example 7

The experiment was performed under the same conditions as those of Example 6, except that the plasma etching was performed under the same conditions as those of the case of manufacturing an NAND type flash memory.

Figure 13:
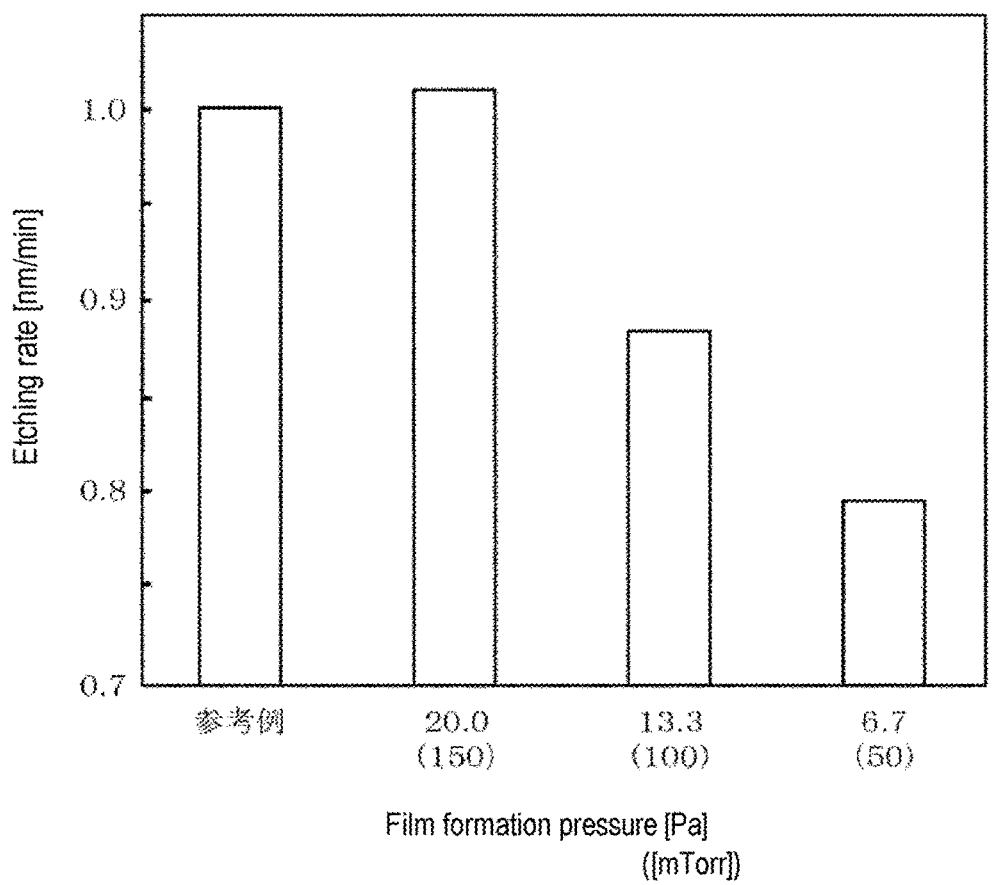
FIG. 13 is a second explanatory view illustrating a relationship between a film formation pressure of a boron film and an etching rate.

Furthermore, as a reference example, the same etching test was also performed on the boron film formed by the method described in Reference example 2-1 already described above.
B. Experimental Results The results of Example 7 are illustrated in FIG. 13. The horizontal axis and the vertical axis in FIG. 13 are similar to those of the case of FIG. 12.

According to the results illustrated in FIG. 13, it was confirmed that, even when the conditions of the plasma etching are changed, the etching rate of the boron film decreases as the pressure of the process atmosphere is lowered, which makes it possible to form a boron film with high selectivity and suitable as a hard mask.
(Experiment 8)

A film stress of a boron film formed while changing the pressure of the process atmosphere was measured.
A. Experimental Conditions Example 8

Figure 14:
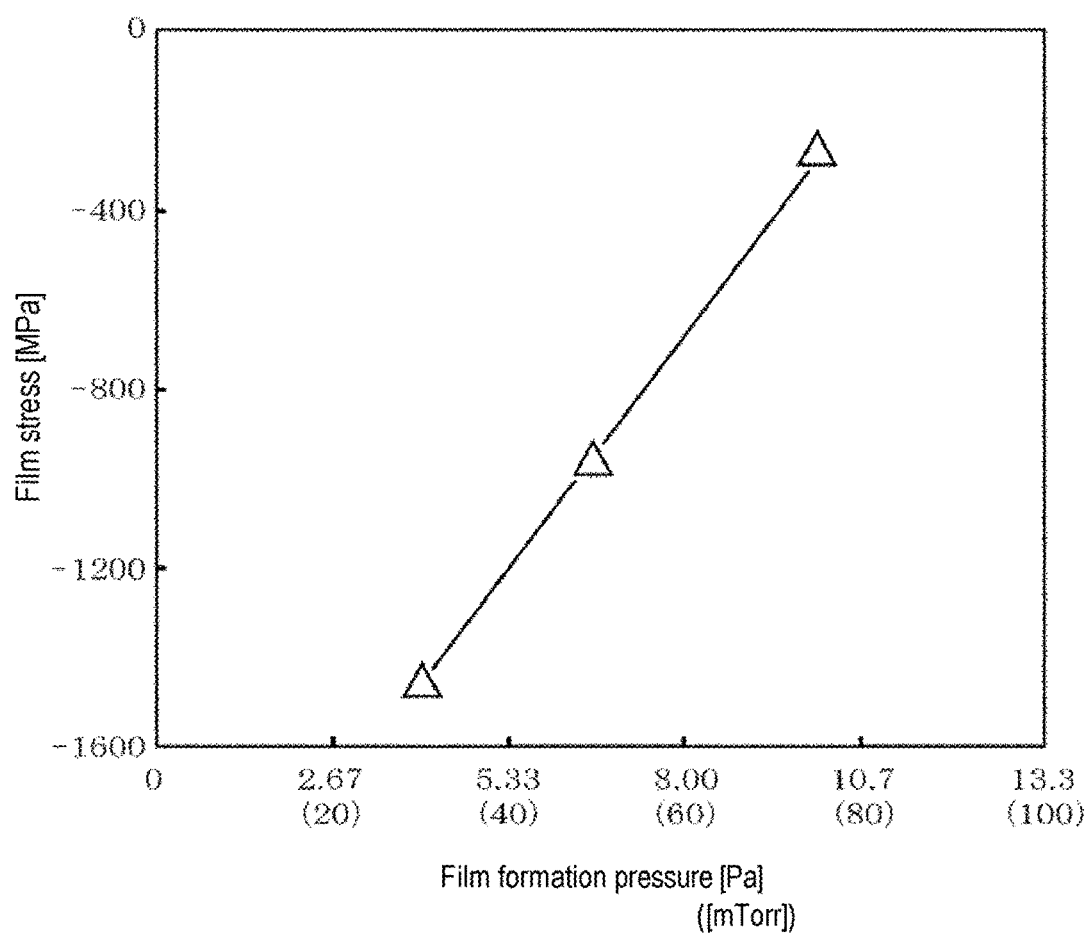
FIG. 14 is an explanatory view illustrating a relationship between a film formation pressure of a boron film and film stress.

A boron film was formed under the same film formation process conditions as those of Example 2-1, except that the pressure of the process atmosphere was changed to 4.0 Pa (30 mTorr), 6.7 Pa (50 mTorr), and 10.0 (75 mTorr). A film stress of the formed boron film was measured using a method (measurement apparatus: 128-NT manufactured by FRONTIER SEMICONDUCTOR COMPANY) for measuring warping of an optical wafer using a laser light.
B. Experimental Results The results of example 8 are illustrated in FIG. 14. In FIG. 14, the horizontal axis represents a pressure of the process atmosphere and the vertical axis represents a film stress.

According to the results illustrated in FIG. 14, the absolute value of the film stress of the boron film tends to increase as the pressure of the process atmosphere is lowered. Generally, a film stress of a film used when manufacturing a semiconductor device is adjusted to about −500 to 0 MPa. In this regard, it was confirmed that, according to the results of Example 8, the pressure of the process atmosphere can be selected as one of control variables for adjusting the film stress.
(Experiment 9)

A difference in introduction of oxygen into the boron film according to a difference in a coating material of a quartz member was investigated.
A. Experimental Conditions Example 9

The dielectric window 41 of the film forming apparatus 1 illustrated in FIG. 1 and an edge ring (not shown) disposed near the wafer W mounted on the mounting table 3 were made of quartz, and surfaces of such quartz members exposed inside the process vessel 2 were coated with a yttria film. An element analysis was conducted by an X-ray photoelectron spectroscopy (XPS) while sputtering the boron film formed using the film forming apparatus 1.

Reference Example 9

Figure 15:
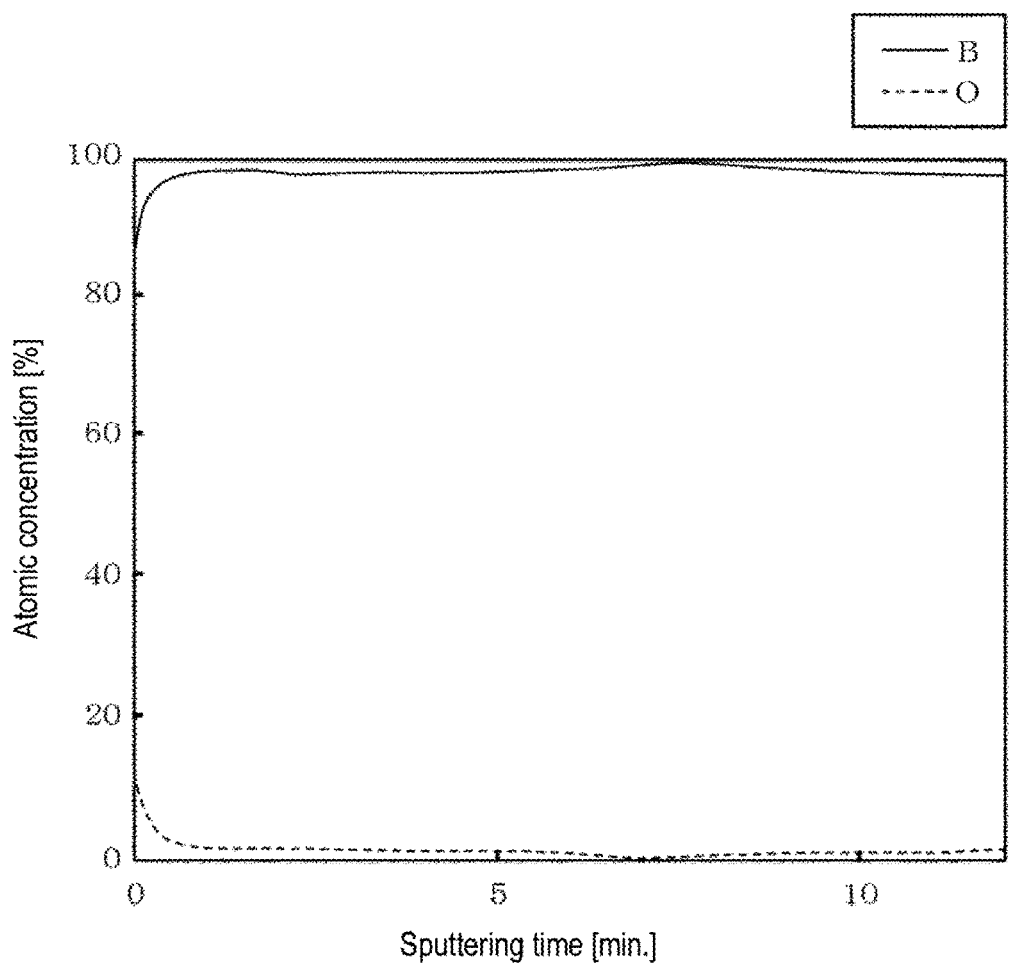
FIG. 15 is a distribution of atoms contained in a boron film which is formed using a quartz member coated with an yttria film.

The same dielectric window 41 and edge ring as those of Example 9 were coated with a boron film. An element analysis was conducted on the surface of the boron film formed by using the film forming apparatus 1 by an energy dispersive X-ray spectrometry (EXD).
B. Experimental Results The results of Example 9 are illustrated in FIG. 15. In FIG. 15, the horizontal axis represents a sputtering time and the vertical axis represents an atomic concentration of boron or oxygen measured by the XPS. In FIG. 15, the atomic concentration of boron is indicated by the solid line and the atomic concentration of oxygen is indicated by the broken line.

According to the results illustrated in FIG. 15, it was confirmed that oxygen was hardly introduced into the boron film except for a region (a region with a short sputtering time) near the surface of the boron film onto which atmospheric oxygen was adsorbed.

Figure 16A:
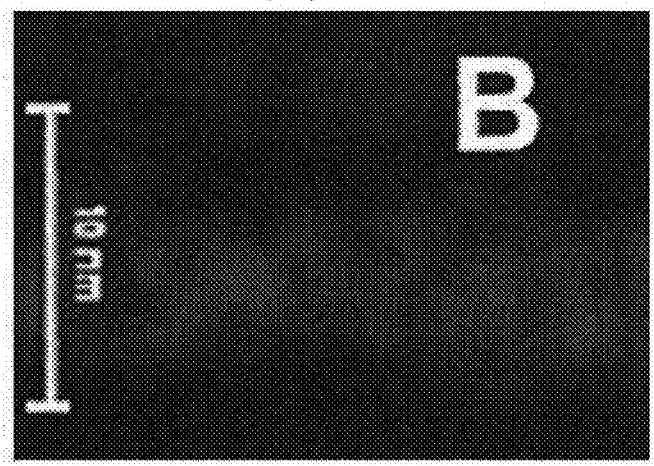
FIGS. 16A and 16B are photographs showing distributions of atoms contained in a boron film which is formed using a quartz member coated with a boron film.
Figure 16B:
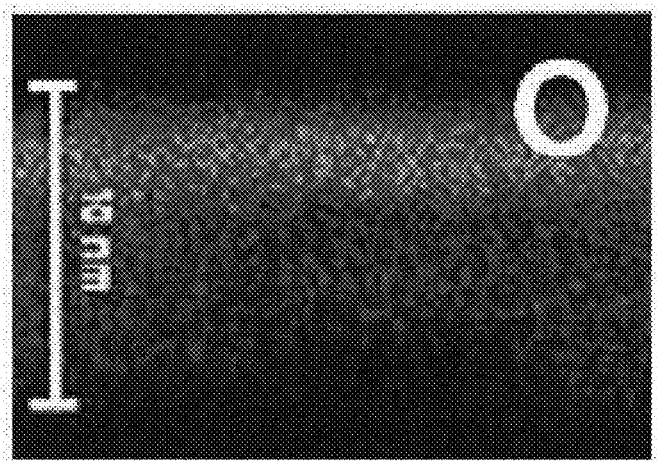

On the other hand, the results of Reference example 9 are illustrated in FIGS. 16A and 16B. FIGS. 16A and 16B illustrate longitudinal sections of formed boron films as the results of EDX analysis. Portions indicated by white colors are regions in which boron atoms and oxygen atoms are present, respectively.

According to FIGS. 16A and 16B, it can be confirmed that the oxygen atoms are also introduced into the boron film. It is presumed that this is because even when the quartz members are coated with a boron film, it is difficult to sufficiently suppress the emission of oxygen from quartz under the process atmosphere in which the reaction gas is plasmarized, and oxygen emitted from the quartz members (the dielectric window 41 or the edge ring) is introduced into the boron film formed on the wafer W.

From the results of Example 9 and Reference example 9 mentioned above, it can be said that the yttria film is a material suitable for coating the quartz members exposed inside the process vessel 2 to suppress the emission of oxygen. In some embodiments, a method of coating the surface of the quartz members with other coating material such as a boron film or the like may be employed. Even if other coating material is used, it is obvious that there is an effect of suppressing the emission of oxygen from the quartz members to some extent.
(Experiment 10)

Various characteristics of a boron film formed by changing the film formation temperature were investigated.
A. Experimental Conditions Example 10-1

Various characteristics described hereinbelow were measured for a boron film formed under the same conditions as those of Example 2-1.

Example 10-2

A boron film was formed under the same conditions as those of Example 10-1 except that the film formation temperature was set at 100 degrees C., and various characteristics described hereinbelow were measured.

Example 10-3

A boron film was formed under the same conditions as those of Example 10-1 except that the film formation temperature was set at 150 degrees C., and various characteristics described hereinbelow were measured.

Example 10-4

A boron film was formed under the same conditions as those of Example 10-1 except that the film formation temperature was set at 200 degrees C., and various characteristics described hereinbelow were measured.

Example 10-5

A boron film was formed under the same conditions as those of Example 10-1 except that the film formation temperature was set at 250 degrees C., and various characteristics described hereinbelow were measured.

Example 10-6

A boron film was formed under the same conditions as those of Example 10-1 except that the film formation temperature was set at 300 degrees C., and various characteristics described hereinbelow were measured.

<Measured Characteristic Items>

(1) Deposition rate: Deposition rates per unit time for the boron films according to Examples 10-1 to 10-6 were obtained.

(2) Dry etching rate: A dry etching was performed on the boron films according to Examples 10-1 and 10-4 to 10-6, and etching rates were obtained.

The dry etching was performed using a plasma etching device under conditions in which the process pressure is 2.67 Pa (20 mTorr), the flow rate of the etching gas is 230 sccm (a mixture gas of $C_4F_6$, $C_4F_8$ and $CH_2F_2$: 140 sccm, and a mixture gas of $O_2$: 90 sccm), and a heating temperature of the wafer W is 150 degrees C.

(3) Measurement of wet etching rate: a wet etching was performed on the boron films according to Examples 10-2 to 10-6 and etching rates were obtained. The wet etching was performed using 69 wt % of aqueous nitric acid at room temperature.

(4) Measurement of sensitivity of etchant: An etching rate was obtained by changing the type of etchant for the boron film according to Example 10-5. As the etchant, hydrogen peroxide ($H_2O_2$: 31 wt %), aqueous nitric acid (69 wt %), aqueous hydrogen fluoride solution (50 wt %), ammonium-hydroxide hydrogen peroxide mixture (APM), and sulfuric acid-hydrogen peroxide mixture (SPM) were used and the wet etching was performed at room temperature.

(5) Measurement of film density: A film density was measured for the boron films according to Examples 10-1 and 10-4 to 10-6 by a rutherford backscattering spectrometry (RBS) measurement and an elastic recoil detection analysis (ERDA) measurement.

(6) Analysis of hydrogen concentration: A concentration of hydrogen atoms contained in the boron films was measured for the boron films according to Examples 10-4 to 10-6 by the RBS measurement and the ERDA measurement.

(7) FT-IR analysis: Structures of the boron films were analyzed for the boron films according to Examples 10-4 to 10-6 by FT-IR.

B. Experiment Results

Figure 17:
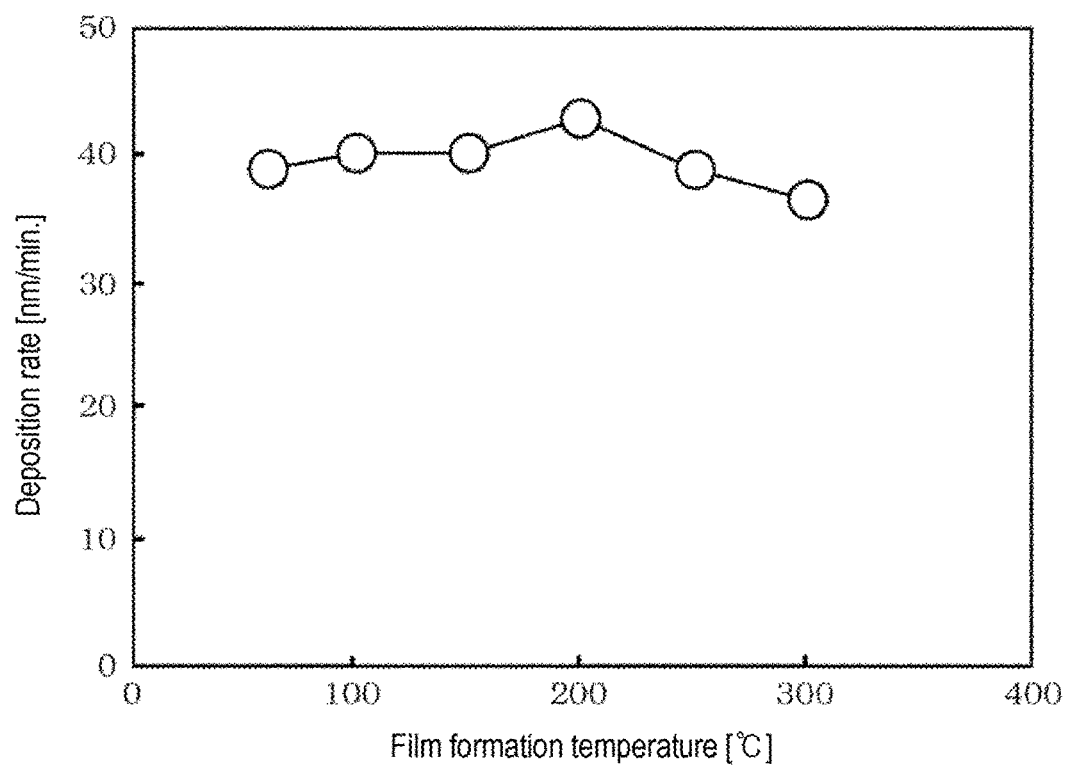
FIG. 17 is an explanatory view illustrating a relationship between a film formation temperature of a boron film and a deposition rate.

Regarding the measured characteristic item (1), the results of deposition rates of the boron films at each film formation temperature are illustrated in FIG. 17. In FIG. 17, the horizontal axis represents a film formation temperature [degrees C.] and the vertical axis represents a deposition rate [nm/min.] of the boron films.

According to the results illustrated in FIG. 17, under the conditions in which the film formation pressure (the internal pressure of the process vessel 2), the supply flow rate of the reaction gas, the high-frequency power for generating plasma, and the like were the same, even when the film formation temperature was changed to fall within a range of 60 to 300 degrees C., the deposition rate was not significantly changed.

Figure 18:
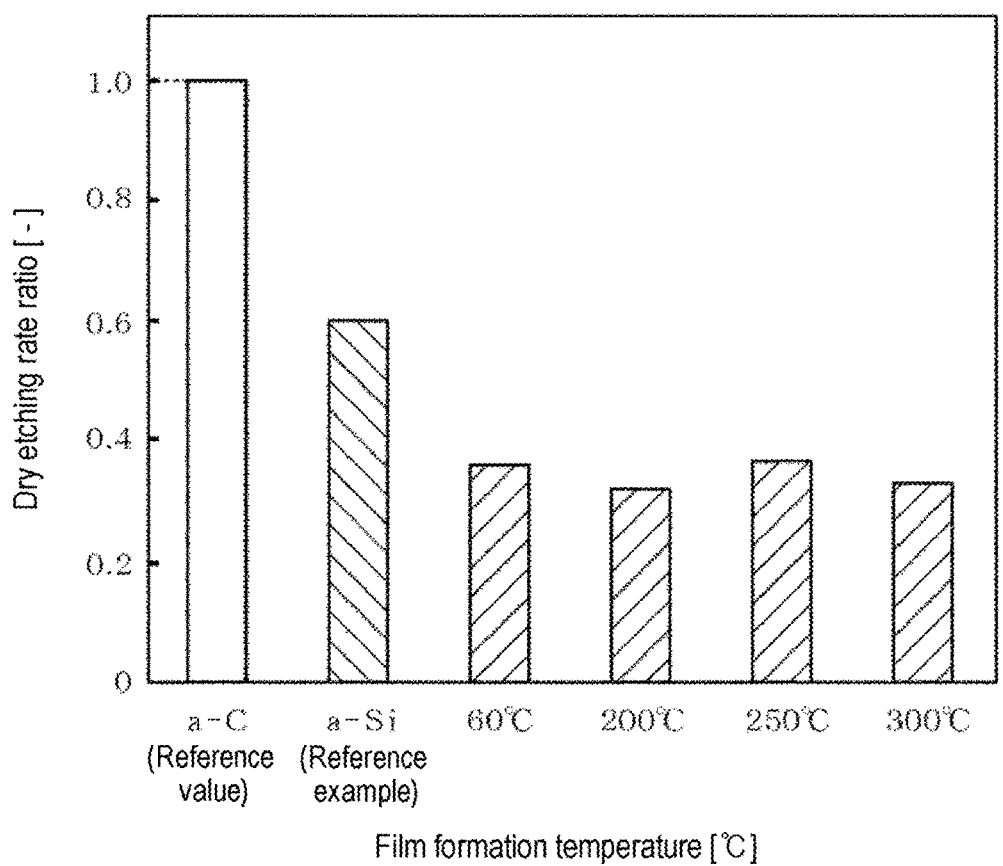
FIG. 18 is an explanatory view illustrating a relationship between a film formation temperature of a boron film and a dry etching rate.

Next, regarding the measured characteristic item (2), the dry etching rates of the boron films formed at each film formation temperature are illustrated in FIG. 18. In FIG. 18, the horizontal axis represents a film formation temperature of each boron film and the vertical axis represents a ratio (ratio of dry etching rate) of a relative etching rate to an etching rate when amorphous carbon (illustrated together with the sign of "a-C" as a reference value in FIG. 18) used as a hard mask material in the related art was dry-etched under the same conditions.

Furthermore, as a reference example, in FIG. 18, a ratio of dry etching rate of amorphous silicon (illustrated together with the sign of "a-Si" in FIG. 18) used as a hard mask material different from the amorphous carbon in the related art is also illustrated.

According to the results illustrated in FIG. 18, it was confirmed that the boron films formed at the film formation temperature ranging from 60 to 300 degrees C. all have etching resistance of about 2.5 times that of the amorphous carbon and about 1.5 times that of the amorphous silicon.

Figure 19:
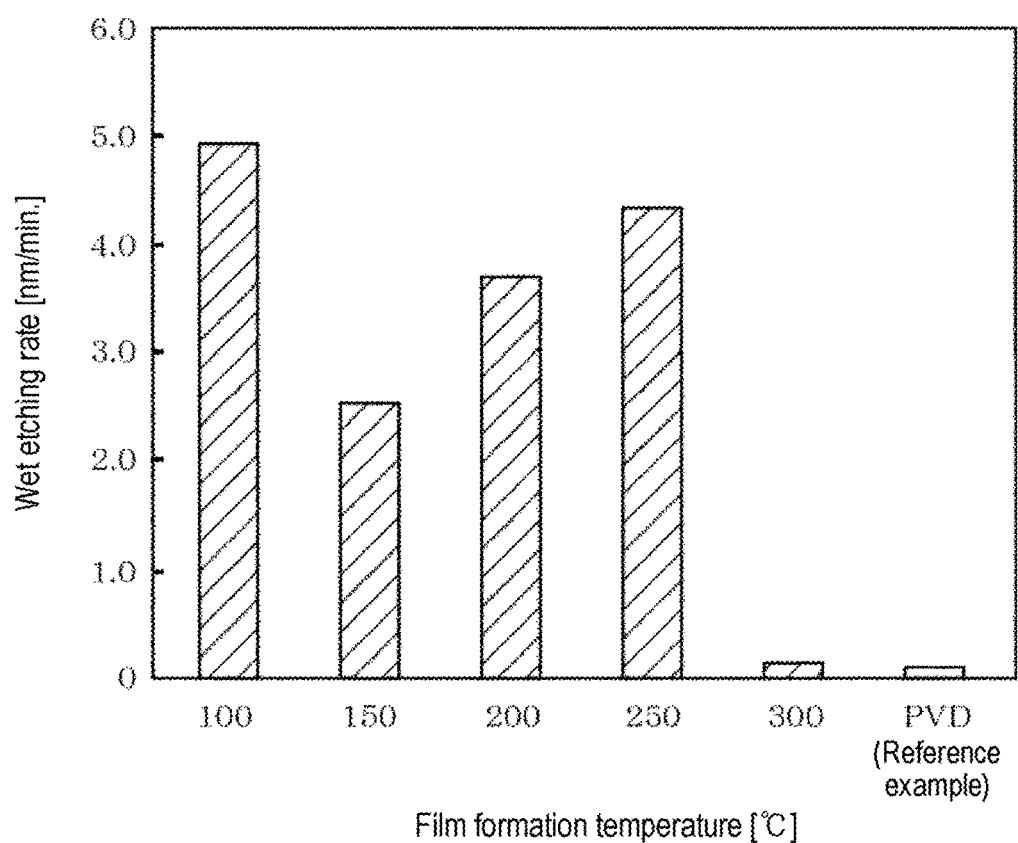
FIG. 19 is an explanatory view illustrating a relationship between a film formation temperature of a boron film and a wet etching rate.

Furthermore, regarding the measured characteristic item (3), the wet etching rates of the boron films formed at each film formation temperature by the aqueous nitric acid are illustrated in FIG. 19. In FIG. 19, the horizontal axis represents a film formation temperature of each boron film and the vertical axis represents a wet etching rate [nm/min.].

As a reference example, in FIG. 19, a wet etching rate of a boron film (illustrated together with the label of "PVD" in FIG. 19) formed by a physical vapor deposition (PVD) in the related art is also illustrated.

According to the results illustrated in FIG. 19, the boron film formed at the film formation temperature of 300 degrees C. and the boron film formed by the PVD were hardly removed by the aqueous nitric acid.

In contrast, the boron films formed at the film formation temperature ranging from 100 to 250 degrees C. were all removed (etched) by the aqueous nitric acid, although etching rates were different within a range of about 2.5 to 5.0 [nm/min.]. That is to say, it can be said that the boron films formed within a range of the film formation temperatures have high etching characteristics during the dry etching (FIG. 18) and are relatively easily removed using the aqueous nitric acid after it is used as the hard mask during the dry etching, having characteristics suitable for a hard mask material.

Figure 20:
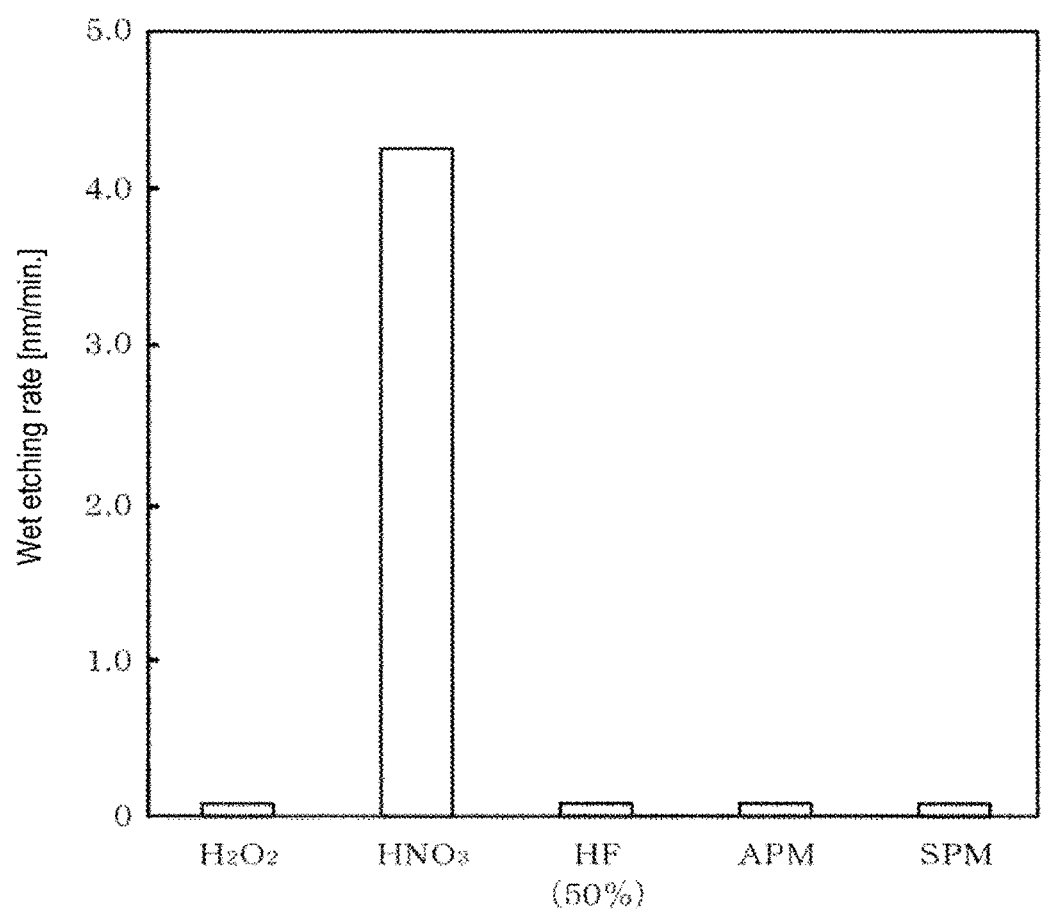
FIG. 20 is an explanatory view illustrating a relationship between a type of etchant and a wet etching rate of a boron film.

Regarding the measured characteristic item (4), etching rates when a boron film formed at 250 degrees C. was etched using different kinds of etchants are illustrated in FIG. 20. In FIG. 20, the horizontal axis represents a type of etchant and the vertical axis represents a wet etching rate [nm/min.].

As illustrated in FIG. 20, it can be seen that the boron film formed at the film formation temperature of 250 degrees C. has unique characteristics that it can be etched only when the aqueous nitric acid was used as an etchant and is hardly etched by any other etchant. In addition, it was confirmed that a boron film formed at another film formation temperature lower than 300 degrees C. (e.g., 60 to 250 degrees C.) has the same wet etching characteristics as those of the example illustrated in FIG. 20.

Figure 21:
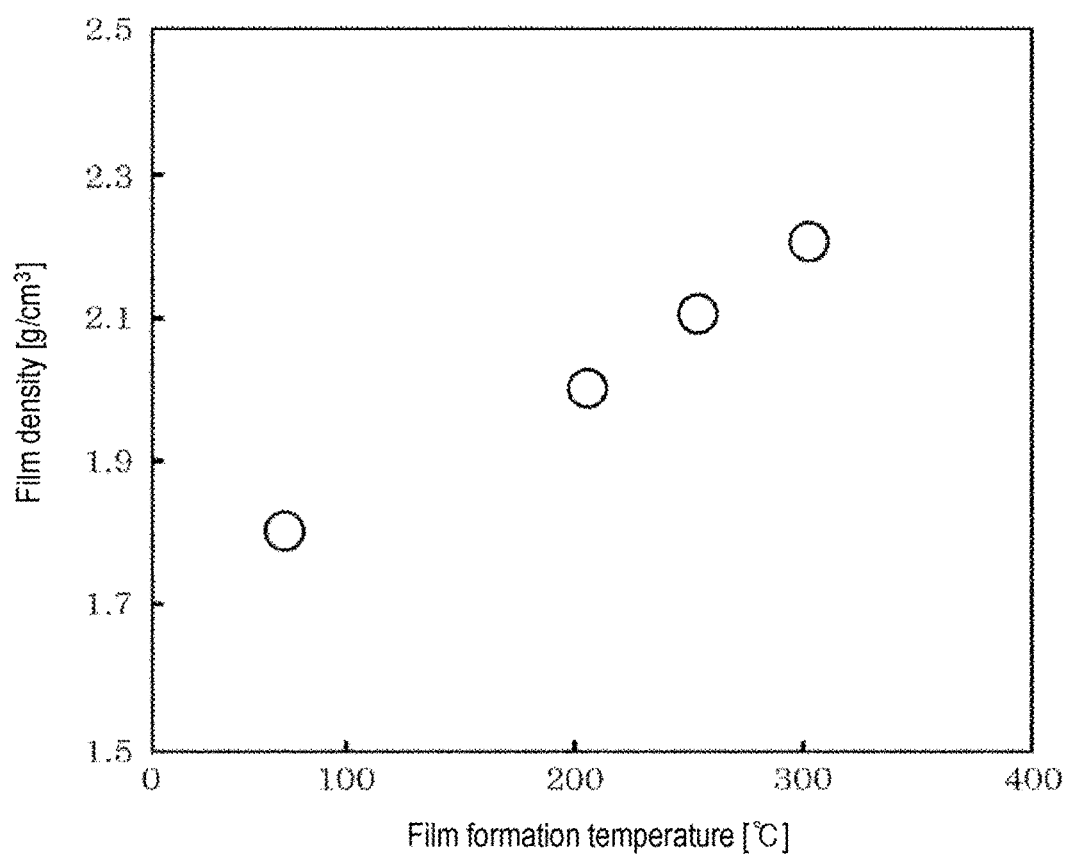
FIG. 21 is an explanatory view illustrating a relationship between a film formation temperature of a boron film and film density.

Furthermore, regarding the measured characteristic item (5), the measurement results of the film density of the boron films formed at each film formation temperature are illustrated in FIG. 21. In FIG. 21, the horizontal axis represents a film formation temperature [degrees C.] and the vertical axis represents a film density [g/cm$^3$] of the boron films.

According to the results illustrated in FIG. 21, as the film formation temperature is lowered, the film density of the boron films is reduced.

Generally, a film with low density tends to have lower etching resistance, regardless of the dry etching or wet etching. However, as described above with reference to FIGS. 18 and 19, the boron film of this example exhibits high dry etching resistance within a range of film formation temperature of 60 to 300 degrees C., while it is removed by etching with the aqueous nitric acid at a film formation temperature lower than 300 degrees C. (a range of 100 to 250 degrees C. in the example illustrated in FIG. 19). Based on these facts, it may be difficult to determine that the unique etching characteristics of the boron film formed at the film formation temperature lower than 300 degrees C. are hardly caused by a decrease in film density.

Figure 22:
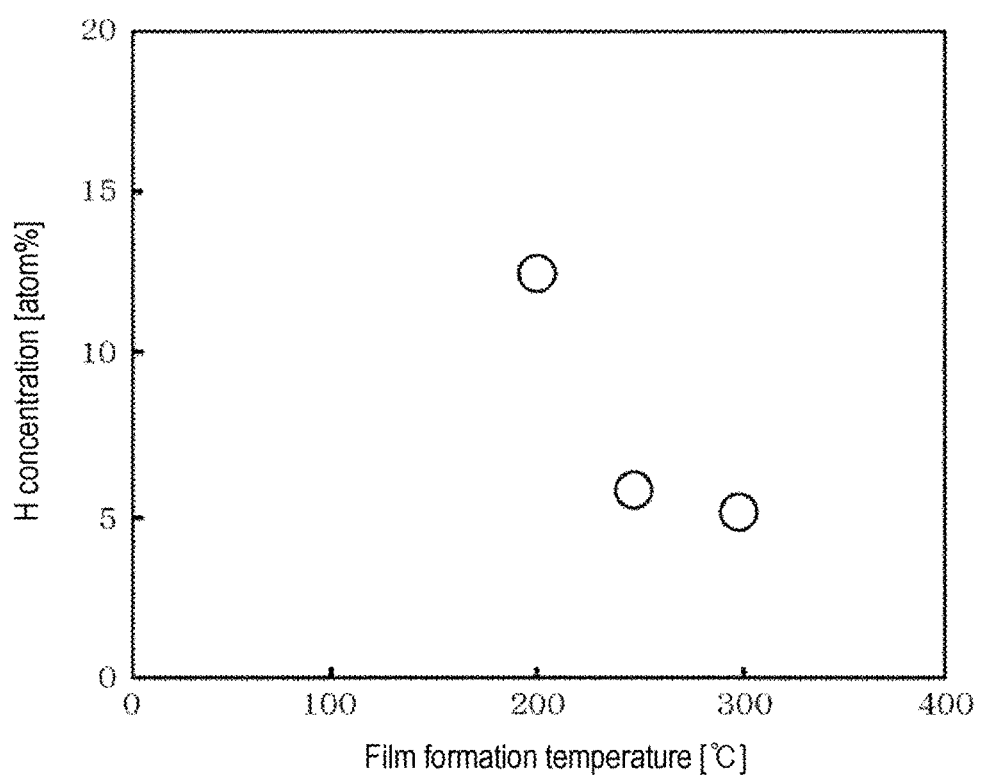
FIG. 22 is an explanatory view illustrating a relationship between a film formation temperature of a boron film and a H (hydrogen atom) concentration.

Furthermore, regarding the measured characteristic item (6), the results of measuring a concentration of hydrogen atoms contained in the boron films formed at each film formation temperature are illustrated in FIG. 22. In FIG. 22, the horizontal axis represents a film formation temperature [degrees C.] and the vertical axis represents an H (hydrogen atom) concentration [atom %] of the boron films.

According to the results illustrated in FIG. 22, it can be seen that, as the film formation temperature is lowered, a hydrogen concentration of the boron film is rapidly increased.

Figure 23:
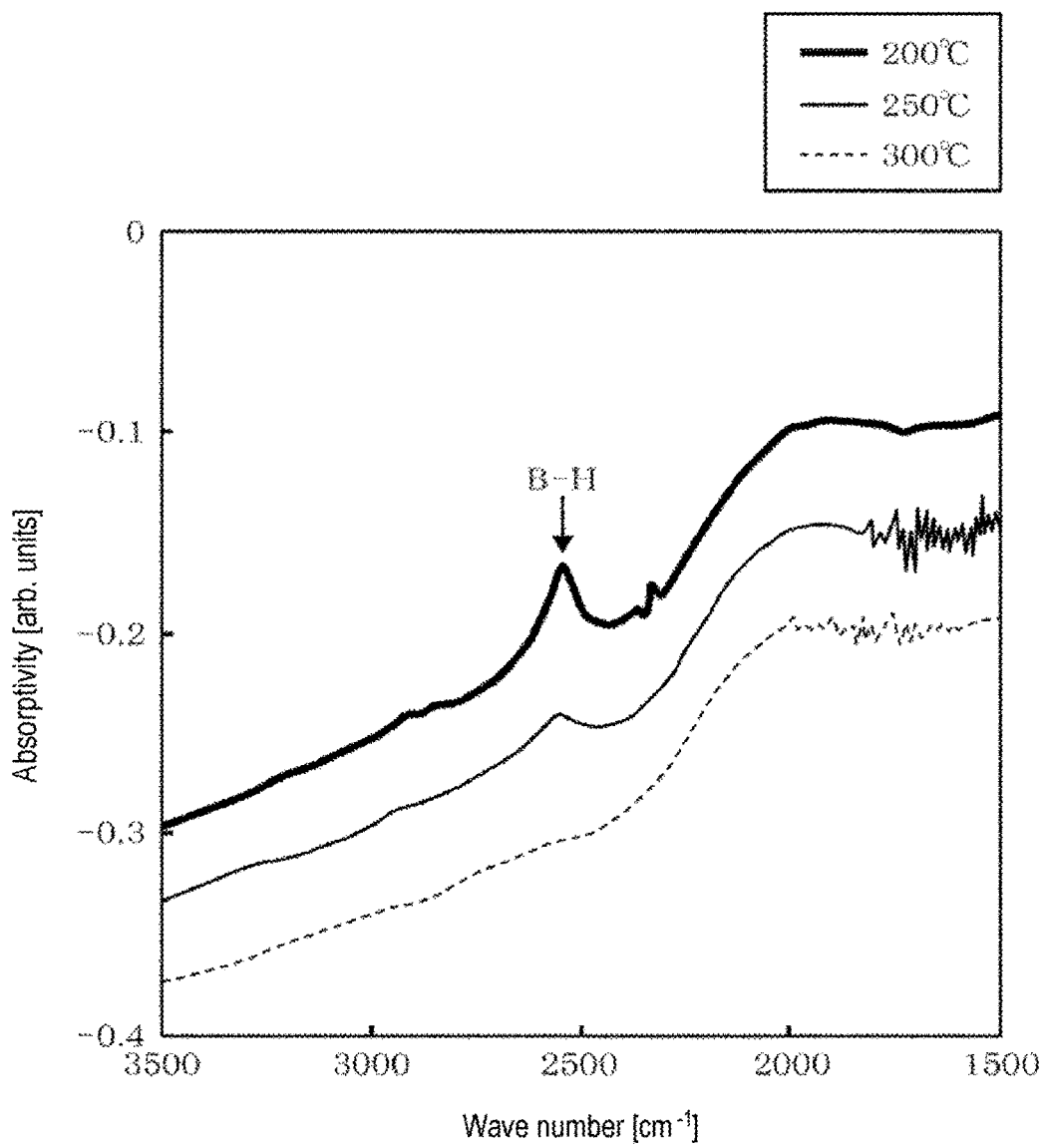
FIG. 23 is a view showing the results of FT-IR analysis of boron films having different film formation temperatures.

Regarding the measured characteristic item (7), the results of analyzing structures of the boron films formed at each film formation temperature by FT-IR are illustrated in FIG. 23. In FIG. 23, the horizontal axis represents a wave number [cm$^{-1}$] and the vertical axis represents absorptivity [arb. units].

In FIG. 23, an absorptivity peak near a wave number of 2,500 [cm$^{-1}$] indicates B—H (boron-hydrogen bond). According to FIG. 23, it can be seen that a boron film whose film formation temperatures were 200 degrees C. and 250 degrees C. includes hydrogen bonded to boron, while a boron film whose film formation temperature was 300 degrees C. contains almost no hydrogen in a state in which it is bonded to boron.

Extracting the features common to the boron films formed at the film formation temperatures (e.g., 60 to 250 degrees C.) lower than 300 degrees C. based on the results of FIGS. 22 and 23, it is estimated that, since hydrogen is contained in a state in which it is bonded to boron in the boron film, the boron film having unique characteristics that it can be relatively easily removed by etching with the aqueous nitric acid, while having high dry etching resistance, is obtained.

Furthermore, the boron film having the unique etching characteristics reviewed with reference to FIGS. 17 to 23 was formed using the $B_2H_6$ gas as a boron-containing gas. However, even when a reaction gas containing a different kind of boron-containing gas is used, if the boron film formed at a film formation temperature lower than 300 degrees C. contains hydrogen atoms having a concentration within a range of about 5 to 15 atom % in a state in which it is bonded to boron atoms and a concentration of any other atoms introduced as an inevitable component such as oxygen, nitrogen or the like is less than 1.0 atm %, it is considered that the boron film exhibits the same etching characteristics as that of using the $B_2H_6$ gas.

According to the present disclosure in some embodiments, a boron film is formed on a substrate by plasmarizing a reaction gas containing a boron-containing gas. By forming the film by utilizing the energy of plasma, it is possible to lower a process temperature during a film formation process to reduce a thermal history, compared with the case where a film is formed by utilizing a thermal energy without using plasma. Furthermore, by using plasma under a process atmosphere regulated to a pressure within a range of 0.67 to 33.3 Pa (5 to 250 mTorr), it is possible to densify a film quality for a film obtained by a thermal CVD method, while suppressing an increase in surface roughness at the same film formation temperature. Even with the same composition, the densified film has high etching resistance and can become a high quality film with high etching selectivity. In this manner, it is possible to form a boron film with good film quality while lowering the film formation temperature.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a boron film on a substrate on which a semiconductor device is formed, by plasmarizing a reaction gas containing a boron-containing gas under a process atmosphere regulated to a pressure which falls within a range of 0.67 to 33.3 Pa (5 to 250 mTorr).

2. The method of claim 1, wherein the boron-containing gas is a gas selected from a group consisting of a diborane gas, a boron trichloride gas, and an alkylborane gas.

3. The method of claim 1, wherein the reaction gas further contains a gas selected from a group consisting of a helium gas, an argon gas, and a hydrogen gas.

4. The method of claim 1, wherein the boron film is formed in a state in which the substrate is heated at a temperature which falls within a range of 60 to 500 degrees C.

5. The method of claim 4, wherein a temperature at which the substrate is heated when the boron film is formed is less than 300 degrees C.

6. The method of claim 5, wherein the boron film is used as a mask when forming a recess by etching a film including a silicon oxide film with a gas.

7. The method of claim 6, wherein the boron film used as the mask is removed from the film including the silicon oxide film by an aqueous nitric acid.

8. The method of claim 1, wherein the reaction gas is plasmarized by supplying a microwave to the reaction gas.

9. The method of claim 8, wherein the microwave is supplied to the reaction gas from an antenna installed above the substrate, and
   a high-frequency power is applied to an electrode part serving as a mounting part on which the substrate is mounted.

10. The method of claim 1, wherein the reaction gas is plasmarized by supplying the reaction gas between parallel plate electrodes to which a high-frequency power is applied to capacitively couple the parallel plate electrodes.

11. A boron film formed on a substrate on which a semiconductor device is formed, by plasmarizing a reaction gas containing a boron-containing gas under a process atmosphere regulated to a pressure which falls within a range of 0.67 to 33.3 Pa (5 to 250 mTorr).

12. The boron film of claim 11, wherein the boron film is used as a mask when forming a recess by etching a film including a silicon oxide film with a gas.

\* \* \* \* \*